US007538023B2

United States Patent
Watanabe

(10) Patent No.: US 7,538,023 B2
(45) Date of Patent: May 26, 2009

(54) METHOD OF MANUFACTURING A SEMICONDUCTOR WAFER DEVICE HAVING SEPARATED CONDUCTIVE PATTERNS IN PERIPHERAL AREA

(75) Inventor: Kenichi Watanabe, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 192 days.

(21) Appl. No.: 11/519,052

(22) Filed: Sep. 12, 2006

(65) Prior Publication Data
US 2007/0010087 A1    Jan. 11, 2007

Related U.S. Application Data

(62) Division of application No. 11/175,314, filed on Jul. 7, 2005, now Pat. No. 7,141,882, which is a division of application No. 09/987,012, filed on Nov. 13, 2001, now Pat. No. 6,940,150.

(30) Foreign Application Priority Data
Jun. 29, 2001    (JP)    ............................. 2001-198595

(51) Int. Cl.
*H01L 21/4763* (2006.01)
(52) U.S. Cl. .............................. 438/622; 257/E21.575; 257/E21.576; 257/E21.577; 438/637
(58) Field of Classification Search ................ 438/622, 438/637; 257/E21.575, E21.576, E21.577
See application file for complete search history.

(56) References Cited

U.S. PATENT DOCUMENTS 5,587,344 A    12/1996    Ishikawa
6,373,136 B2 *  4/2002    Otsuka et al. ................ 257/758
6,376,363 B1    4/2002    Iguchi ......................... 438/633
6,379,782 B2    4/2002    Iguchi et al. ................. 428/209
6,461,916 B1 * 10/2002    Adachi et al. ............... 438/257
6,528,400 B2 *  3/2003    Fukada et al. ............... 438/584
6,555,464 B2 *  4/2003    Fukada et al. ............... 438/622
6,940,150 B2    9/2005    Watanabe .................... 257/622
2002/0008323 A1  1/2002    Watanabe et al. ........... 257/758

FOREIGN PATENT DOCUMENTS

JP    11-265866    9/1999
JP    2000-124216  4/2000

* cited by examiner

*Primary Examiner*—Alexander G Ghyka
*Assistant Examiner*—Seahvosh J Nikmanesh
(74) *Attorney, Agent, or Firm*—Kratz, Quintos & Hanson, LLP.

(57) ABSTRACT

A method of manufacturing a semiconductor wafer device, includes the steps of: (a) forming lower wiring patterns over a semiconductor wafer, the lower wiring patterns being connected to semiconductor elements in a circuit area; (b) forming an interlevel insulating film with a planarized surface over the semiconductor wafer, covering the lower wiring patterns and having a planarized surface; and (c) forming via conductors connected to the lower wiring patterns and wiring patterns disposed on the via conductors in the circuit area and conductor patterns corresponding to the wiring patterns in a peripheral area other than the circuit area, by embedding the via conductors, wiring patterns and conductor patterns in the interlevel insulating film, the conductive patterns being electrically isolated. The method can form a desired wiring structure and can prevent an increase of the percentage of defective devices in an effective wafer area.

11 Claims, 23 Drawing Sheets

EFFECTIVE WAFER AREA    NONEFFECTIVE WAFER AREA (PERIPHERAL WAFER AREA)

EFFECTIVE WAFER AREA    NONEFFECTIVE WAFER AREA
                        (PERIPHERAL WAFER AREA)

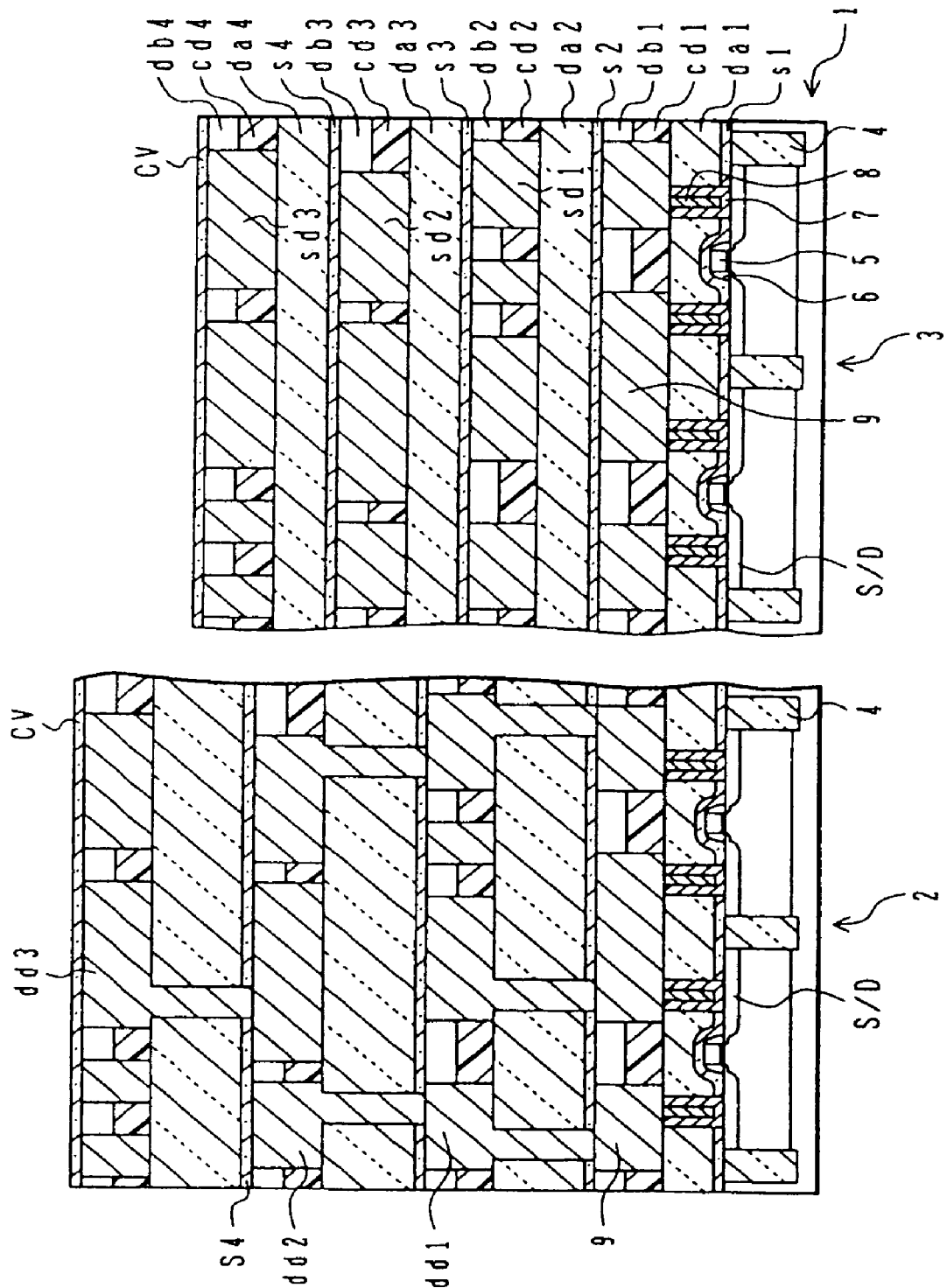

EFFECTIVE WAFER AREA | NONEFFECTIVE WAFER AREA (PERIPHERAL WAFER AREA)

EFFECTIVE WAFER AREA    NONEFFECTIVE WAFER AREA
(PERIPHERAL WAFER AREA)

EFFECTIVE WAFER AREA          NONEFFECTIVE WAFER AREA
                              (PERIPHERAL WAFER AREA)

EFFECTIVE WAFER AREA  NONEFFECTIVE WAFER AREA (PERIPHERAL WAFER AREA)

EFFECTIVE WAFER AREA    NONEFFECTIVE WAFER AREA
(PERIPHERAL WAFER AREA)

METHOD OF MANUFACTURING A SEMICONDUCTOR WAFER DEVICE HAVING SEPARATED CONDUCTIVE PATTERNS IN PERIPHERAL AREA

RELATED APPLICATIONS

This application is a divisional application of U.S. application Ser. No. 11/175,314, filed Jul. 7, 2005, now U.S. Pat. No. 7,141,882, which application is a divisional application of U.S. patent application Ser. No. 09/987,012 filed Nov. 13, 2001, now U.S. Pat. No. 6,940,150, issued Sep. 6, 2005, which application claims priority and is based on Japanese Patent Application 2001-198595, filed on Jun. 29, 2001, all of which the entire contents are incorporated herein by reference.

BACKGROUND OF THE INVENTION

A) Field of the Invention

The present invention relates to a semiconductor wafer device and its manufacture method, and more particularly to a semiconductor wafer device having a damascene wiring structure and its manufacture method.

In this specification, an etching stopper layer is intended to mean a layer having an etch rate of one fifth or smaller than an etch rate of another layer under etching, in order that even if the etching stopper layer is exposed during etching, this etching stopper layer is prevented from being etched excessively.

B) Description of the Related Art

A higher integration density of semiconductor devices is desired increasingly. Conventionally, a wiring pattern is formed by forming an Al wiring layer or a W wiring layer on an insulating layer, thereafter forming an etching mask made of a resist pattern or the like on the wiring layer, patterning the wiring layer and embedding it with another the insulating layer.

As the integration density becomes high, there is an increasing need to narrow a width of a wiring pattern and a pitch between wiring patterns. Such fine patterning is now confronted in some cases to a limit in the techniques of forming a wiring pattern by directly pattering a wiring layer. This process is gradually replaced by a damascene wiring process by which a wiring groove and a via hole are formed in an insulating layer, a wiring layer is deposited on the insulation film, being filled in these wiring groove and via hole, and an unnecessary wiring layer on the top surface of the insulating layer is removed by chemical mechanical polishing (CMP).

As the wiring material, Cu is used recently which has a lower resistivity and a higher electro migration resistance than Al, Al alloy, W and the like. Although Cu provides excellent performances as the wiring material, it is likely to be oxidized forming an oxide film thereon, the oxide being not as chemically stable as the oxide of Al. It is necessary therefore to pay attention to a wiring structure and a wiring forming process.

As a damascene process of connecting upper and lower wiring patterns by a via conductor, a single damascene process and a dual damascene process are known. In the single damascene process, a via hole is formed through a lower interlevel insulating film a via conductor is filled in the via hole, thereafter an upper interlevel insulating film is formed, a wiring groove is formed, and then a wiring pattern is filled in the wiring groove. In the dual damascene process, after a via hole and a wiring groove are formed in an interlevel insulating film, wiring material is filled in the via hole and wiring groove at the same time.

As the dual damascene process, there are a first-via type that a via hole is first formed and then a wiring groove is formed and a last-via type that a via hole is formed after a wiring groove is formed.

As the wiring density becomes high, a capacitance between wiring patterns is likely to become high. As the capacitance of a wiring pattern becomes high, a signal transmission speed lowers. In order to reduce the capacitance of a wiring pattern, it is effective to lower the dielectric constant of an insulating layer. In addition to a conventional silicon oxide insulating layer, other insulating layers have been used recently, such as: an insulating layer made of silicon oxide doped with fluorine or carbon; an insulating layer made of coating type hydrocarbon-containing organic insulating material; an insulating layer made of coating type inorganic insulating material; and a porous insulating layer containing voids.

These wiring techniques have not been developed sufficiently. It may occur that if techniques are improved in one aspect, a problem at another point occurs and a percentage of defective devices increases.

SUMMARY OF THE INVENTION

It is an object of the present invention to provide a method of manufacturing a semiconductor wafer device capable of forming a desired wiring structure and suppressing an increase of the percentage of defective devices.

It is another object of the invention to provide a semiconductor wafer device capable of forming a desired wiring structure in an effective wafer area and reducing causes of generating defects.

According to one aspect of the present invention, there is provided a semiconductor wafer device comprising a semiconductor wafer having a circuit area disposed in a central area of said semiconductor wafer and a peripheral area of said semiconductor wafer not formed with circuits; a number of semiconductor elements formed in the circuit area; a multi-layer wiring structure formed in the circuit area and having multi-layer wirings connected to said semiconductor elements and interlevel insulating films, at least some of the multi-layer wirings being damascene wirings including wiring patterns and via conductors embedded in the interlevel insulating films; and a multi-layer structure formed in the peripheral area, having insulating films made of a same materials as the interlevel insulating films and conductor patterns made of same materials as the wiring patterns, and not having conductor patterns corresponding to the via conductors.

According to another aspect of the invention, there is provided a method of manufacturing a semiconductor wafer device, comprising the steps of: (a) forming lower wiring patterns on a semiconductor wafer having semiconductor elements formed in a circuit area, the lower wiring patterns being connected to the semiconductor elements; (b) forming an interlevel insulating film on the semiconductor wafer, the interlevel insulating film covering the lower wiring patterns and having a planarized surface; and (c) forming via conductors connected to the lower wiring patterns and wiring patterns disposed on the via conductors in the circuit area and conductor patterns made of a same material as corresponding to the wiring patterns in a peripheral area other than the circuit area, by embedding the via conductors, wiring patterns and conductor patterns in the interlevel insulating film, the conductive patterns being electrically separated.

According to another aspect of the present invention, there is provided a method of manufacturing a semiconductor wafer device, comprising the steps of: (a) forming a first insulating layer having a lower dielectric constant than silicon oxide on an underlying structure including a semiconductor wafer; (b) removing the first insulating layer in a peripheral area of the semiconductor wafer; (c) forming a second insulating layer having a higher dielectric constant than the first insulating layer, the second insulating layer covering an outermost side wall of the first insulating layer; (d) forming wiring grooves at least through the second insulating layer; (e) forming a conductive layer on the second insulating layer; and (f) polishing the conductive layer to leave wiring patterns in the wiring grooves and to form a configuration wherein an outermost side wall of the first insulating layer is covered with the second insulating layer or the conductive layer.

A film peel-off at a semiconductor wafer edge and the like can be prevented and a manufacture yield in the effective wafer area can be improved.

BRIEF DESCRIPTION OF THE DRAWINGS

FIGS. A1 to 1I are cross sectional views and plan views illustrating the manufacture processes for a semiconductor wafer device according to an embodiment of the invention.

FIG. 4 is a schematic cross sectional view showing an example of the structure of a semiconductor wafer device manufactured by one of the embodiment methods.

DETAILED DESCRIPTION OF THE PREFERRED EMBODIMENTS

Prior to describing the embodiments, fundamental issues to be studied will be described.

FIGS. 12A to 12D are schematic cross sectional views of a semiconductor wafer device illustrating an example of a dual damascene wiring process. The left portion of each of FIGS. 12A to 12D shows an effective wafer area of a semiconductor wafer in which effective circuit chips are formed, and the right portion shows a noneffective wafer area in which effective circuit chips are not formed.

Figure 12A:
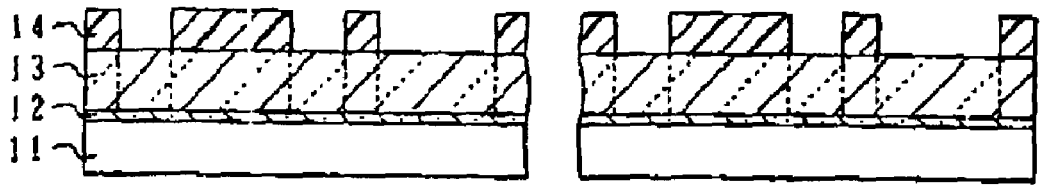
FIGS. 12A to 12D are cross sectional views illustrating the manufacture processes for a semiconductor wafer device according to conventional techniques.

As shown in FIG. 12A, on an underlying structure 11, a first etching stopper layer 12 and a first insulating layer 13 are stacked. The underlying structure 11 is, for example, a structure having a semiconductor substrate formed with semiconductor devices on which an insulating film with W plugs filled therein is formed. The underlying structure may be a single damascene wiring structure having only via conductors. A first photoresist layer 14 having openings of wiring patterns (including conductor patterns to be described later) is formed on the first insulating layer 13.

The noneffective wafer area is not formed with circuits. However, in order to mitigate the influence of a change in process parameters upon the whole wafer area, conductor patterns analogous to the wiring patterns in the effective wafer area are formed in the noneffective wafer area.

By using the first photoresist layer 14 as a mask, the underlying insulating layer 13 is etched by reactive ion etching using CF-containing plasm. This etching automatically stops at the first etching stopper layer 12.

Figure 12B:
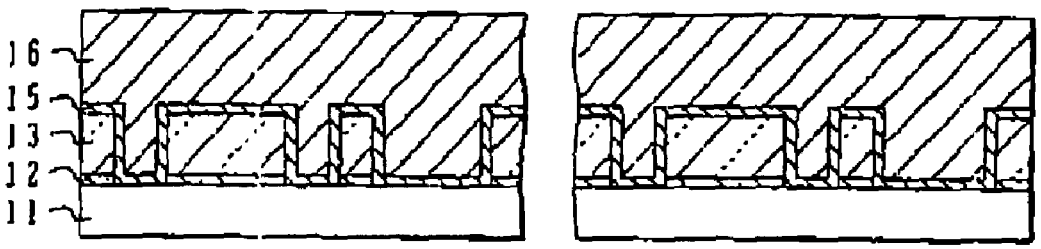

Next, ashing by $O_2$ gas plasma is performed to remove the first photoresist layer 14. In this case, since the conductor on the surface of the underlying structure 11 is covered with the first etching stopper layer 12, oxidation can be prevented. After the first photoresist layer 14 is removed, the exposed etching stopper layer 12 is removed by RIE using CHF-containing etching gas. In this manner, wiring grooves are formed. As shown in FIG. 12B, a first barrier metal layer 15 is formed by sputtering, covering the inner surfaces of the wiring grooves. Thereafter, a first main wiring layer 16 is formed by sputtering or plating. If the first main wiring layer is formed by plating, first a seed layer is formed by sputtering, and then the remaining main wiring layer is formed on the seed layer by plating.

After the main wiring layer 16 is formed, the first main wiring layer 16 and first barrier metal layer 15 higher than the surface of the first insulating film 13 are removed by chemical mechanical polishing (CMP). The first main wiring layer is made of, for example, Cu. If this first main wiring layer is exposed in the air, it is easily oxidized.

Figure 12C:
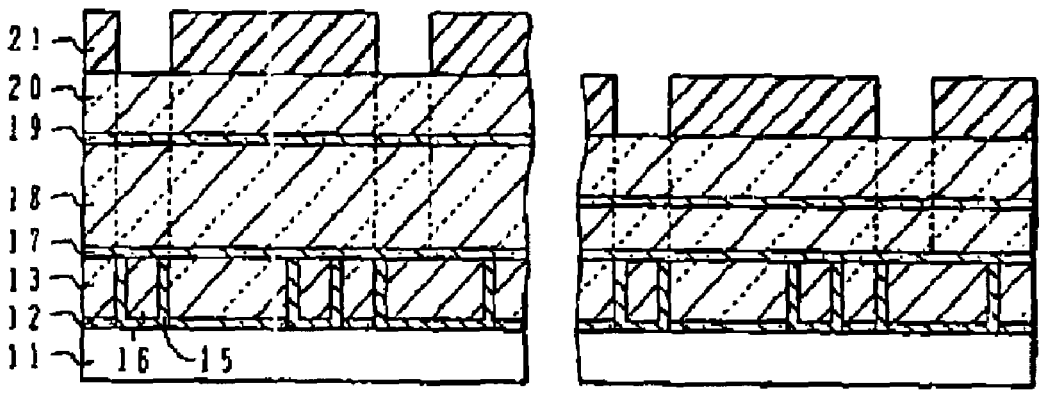

As shown in FIG. 12C, immediately after CMP, the main wiring layer 16 is covered with a second etching stopper layer 17 having an oxygen shielding function. A second insulating layer 18 is formed on the second etching stopper layer 17.

In FIG. 12C, the surface of the first insulating film 13 and the upper surfaces of the first main wiring layer 16 filled in the wiring groove and the first barrier metal layer 15 are drawn evenly. However, in practice, if overpolishing of CMP is performed, a dishing phenomenon occurs in which the first main wiring layer 16 and first barrier metal layer 15 are indented lower than the first insulating layer 13. The second etching stopper layer 17 and second insulating layer 18 formed thereon also have indented shapes in the dishing areas.

FIGS. 13A to 13G are cross sectional views explaining the dishing phenomenon and its influence.

Figure 13A:
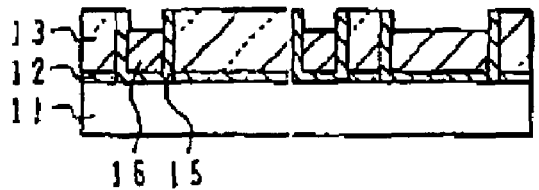
FIGS. 13A to 13G are cross sectional views illustrating dishing and associated problems.

FIG. 13A shows the case that only the main wiring layer 16 is subjected to dishing. As compared to the surface of the first insulating film 13, the surface of the first main wiring layer 16 is indented.

Figure 13B:
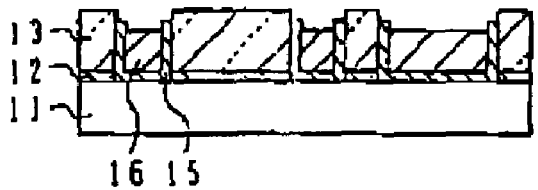

FIG. 13B shows the case that the main wiring layer and barrier metal layer are both subjected to dishing. As compared to the surface of the first insulating film 13, the surface of the barrier metal layer 15 is indented lower, and the surface of the main wiring layer 16 is indented much lower.

Figure 13C:
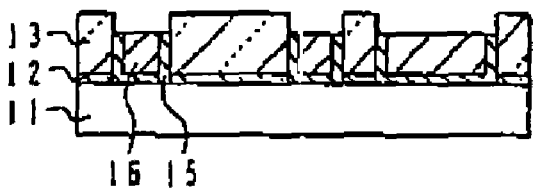

FIG. 13C shows the case that the barrier metal layer 15 and main wiring layer 16 have the same etching rate and are indented by the same depth from the surface of the first insulating layer 13.

Figure 13D:
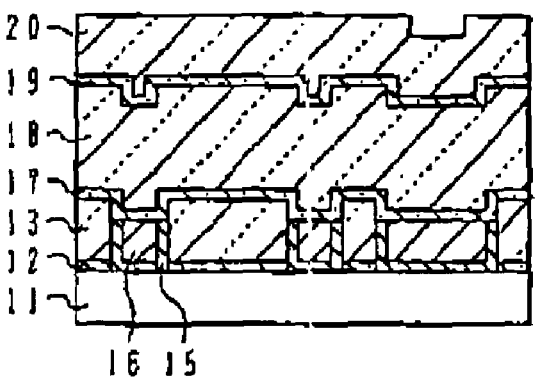

FIG. 13D shows the case that the second etching stopper layer 17 and second insulating layer 18, a third etching stopper layer 19 and a third insulating layer 20 are sequentially formed on the surface having dishing areas. In he process of forming an insulating layer, although the surface of the insulating layer corresponding to a narrow concave portion on the underlying structure has a possibility of being planarized, the surface of the insulating layer corresponding to a broad concave portion cannot be planarized and has a concave shape. The surface of the third insulating layer 20 has a recess in the broad dishing area.

Figure 13E:
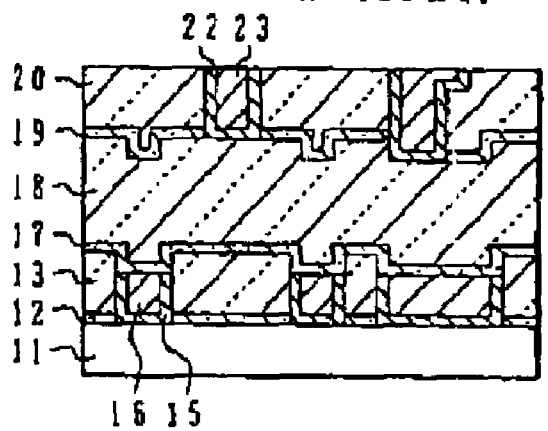

FIG. 13E shows the case that a damascene wiring structure is formed on an insulating layer influenced by dishing. After wiring grooves are formed through the third insulating layer 20 and third etching stopper layer 19 and a barrier metal layer 22 and a main wiring layer 23 are formed, the barrier metal layer 22 and main wiring layer 23 on the surface of the third insulating layer 20 are removed by CMP.

There is a possibility that the barrier metal layer 22 and main wiring layer 23 deposited in the recessed surface areas of the third insulating layer 20 subjected to dishing are left even after CMP. A wiring pattern extending right from the right damascene wiring pattern shown in FIG. 13E corresponds to the recessed surface area. A wiring pattern becomes different from a desired wiring pattern and there is a possibility that desired electric characteristics cannot be obtained.

Figure 13F:
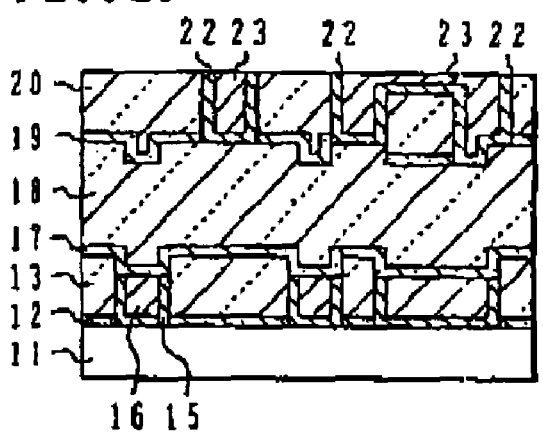

FIG. 13F shows another example of the influence of dishing. Three wiring patterns are formed through the third insulating layer 20 and third etching stopper layer 19. The surface of the third insulating layer 20 has a dishing recess in which two wiring patterns are formed. The barrier metal layer 22 and main wiring layer 23 formed in the recess are not completely removed by CMP and a fraction thereof is left. Therefore, the two wiring patterns are electrically shorted by the left main wiring layer and barrier metal layer.

Figure 13G:
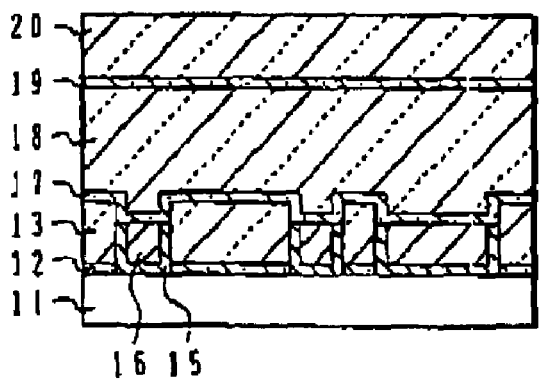

FIG. 13G is a schematic cross sectional view showing the structure of the second insulating layer 18 which is subjected to CMP to planarize the surface thereof in order to avoid the influence of dishing. The surface of the second insulating layer 18 is planarized by CMP. The third etching stopper layer 19 and third insulating layer 20 formed thereon have, therefore, flat surfaces.

Referring to FIG. 12C, in order to avoid the influence of dishing, after the second insulating layer 18 is formed, its surface is planarized by CMP. It is difficult to perform CMP uniformly over the whole wafer surface. The wafer peripheral area is likely to be polished more than the wafer central area, because of a distribution of a pressure applied to the wafer, a distribution of a slurry supply amount and the like. There is, therefore, a tendency that the first insulating layer 18 after CMP is thick in the wafer central area and thin in the wafer peripheral area.

After CMP, on the surface of the second insulating layer 18, the third etching stopper layer 19 and third insulating layer 20 are formed. On the third insulating layer 20, a second photoresist layer 21 having a via hole pattern is formed.

By using the second photoresist layer 21 as an etching mask, the third insulating layer 20, third etching stopper layer 19 and second insulating layer 18 are etched by RIE using CF-containing etching gas. By controlling the etching conditions, the etching is stopped at the surface of the second etching stopper layer 17.

Thereafter, the second photoresist layer 21 is removed by ashing using $O_2$ gas plasma. In this case, the surface of the first main wiring layer 16 in the effective wafer area is covered with the second etching stopper layer 17 so that the first main wiring layer 16 is protected from $O_2$ plasma.

Thereafter, a new photoresist layer is formed on the third insulating layer 20 by protecting the inside of the via holes if necessary. Openings are formed through the third insulating layer 20. By using the photoresist layer as a mask, the third insulating layer 20 is etched. After the new photoresist layer is removed, the exposed third etching stopper layer 19 and second etching stopper layer 17 are removed and wiring grooves and via holes are formed. A conductive layer is filled in the wiring grooves and via holes at the same time. An unnecessary conductive layer is removed by CMP to complete the dual damascene wiring structure.

Figure 12D:
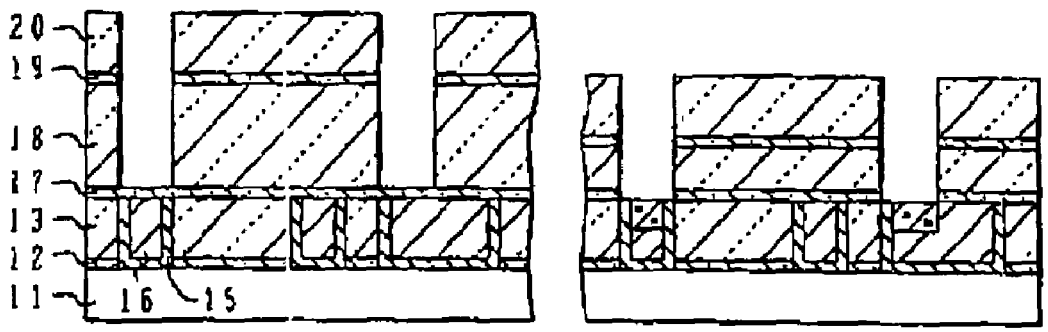

As shown in FIG. 12D, while the second insulating layer 18 in the effective wafer area is etched, etching the second insulating layer 18 in the noneffective wafer area near the wafer periphery is completed and the second etching stopper layer 17 is gradually etched and the surface of the first main wiring layer 16 may bet-exposed. As the main wiring layer 16 is exposed during RIE using CF-containing gas, there is a possibility that the surface of the main wiring layer 16 is decomposed by CF-containing gas. If the main wiring layer 16 is exposed to $O_2$ gas plasma during ashing for removing a resist layer to be performed later, the surface of the main wiring layer 16 is oxidized.

The noneffective wafer area is an area not intended to be used for forming circuits. Even if the surface of the main wiring layer is decomposed, the structure in the effective wafer area is not directly influenced. However, for example, an oxidized main wiring layer increases its volume. Decomposition lowers adhesion to a nearby interlevel insulating film. At later wafer processes such as heat treatment and polishing, film peel-off or the like occurs at the wafer periphery or the like. The peeled-off film moves toward the effective wafer area so that the percentage of defective devices in the effective wafer area increases.

Such phenomena are not limited only to the dual damascene wiring process, but occur also for the single damascene wiring process.

Figure 14A:
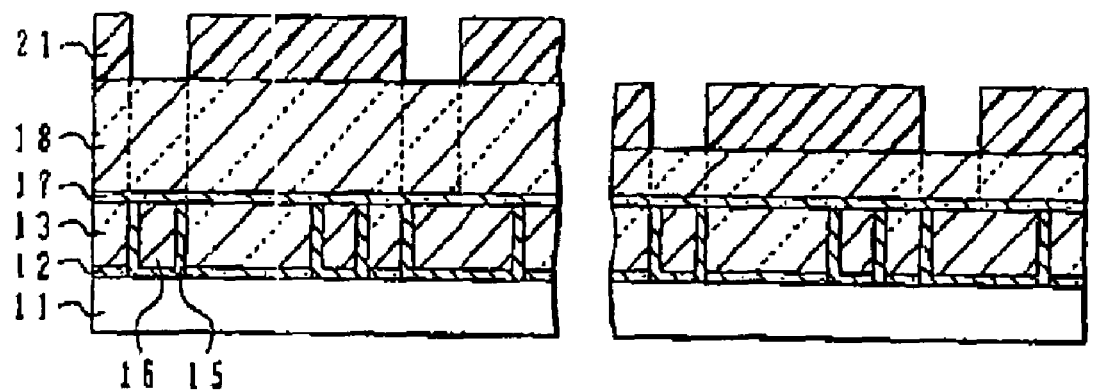
FIGS. 14A and 14B are schematic cross sectional views illustrating the manufacture processes for a semiconductor wafer device according to other conventional techniques.
Figure 14B:
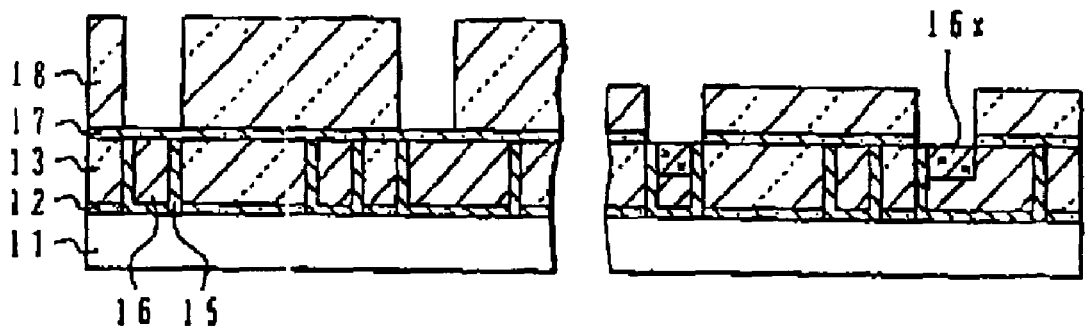

FIGS. 14A and 14B show the case that a single damascene wiring structure is formed. Referring to FIG. 14A, the processes of forming the second insulating layer 18 on the second etching stopper layer 17 and planarizing the surface by CMP are similar to those described with reference to FIG. 12C. On the second insulating layer 18, a photoresist layer 21 having openings for a via hole pattern is formed. By using this photoresist layer 21 as an etching mask, the second insulating layer 18 is etched. Similar to the effective wafer area, the via hole pattern is also distributed in the noneffective wafer area.

As shown in FIG. 14B, after via holes are formed through the second insulating layer 18 in the effective wafer area, the photoresist layer 21 is removed by ashing. While the second insulating layer 18 in the effective wafer area is etched, etching the second insulating layer 18 in the noneffective wafer area is completed, the second etching stopper layer 17 is gradually etched and the underlying main wiring layer 16 may be exposed.

As the main wiring layer 16 is exposed during etching using CF-containing gas, the main wiring layer may be decomposed. During ashing for removing the photoresist layer to be performed later, the surface of the exposed main wiring layer 16 is oxidized (indicated at 16x in FIG. 14B). As above, also in the single damascene process, similar problems to the dual damascene process occur.

In order to prevent the upper level wiring layer from being influenced by dishing, it is necessary to perform CMP. As CMP is performed, there arises another problem that the thickness of the insulating layer becomes thin in the peripheral wafer area.

Figure 1A:
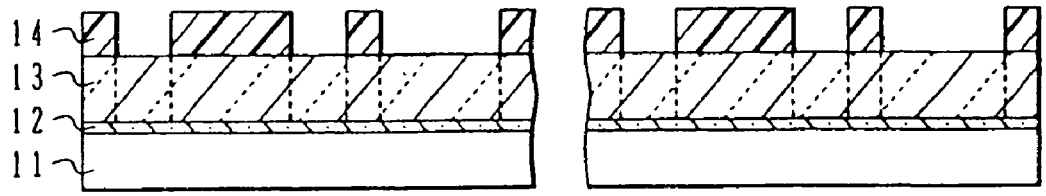
Figure 1B:
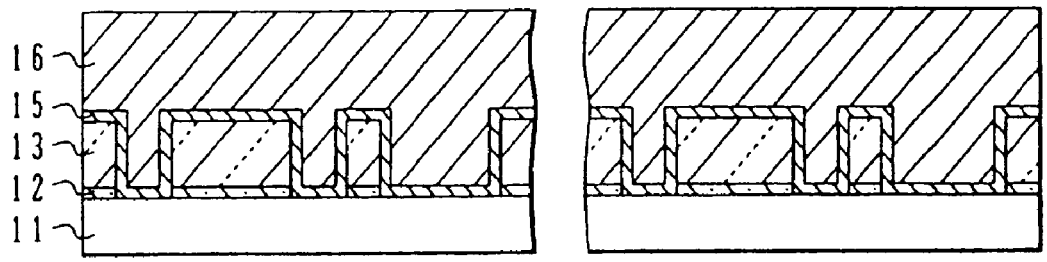
Figure 1C:
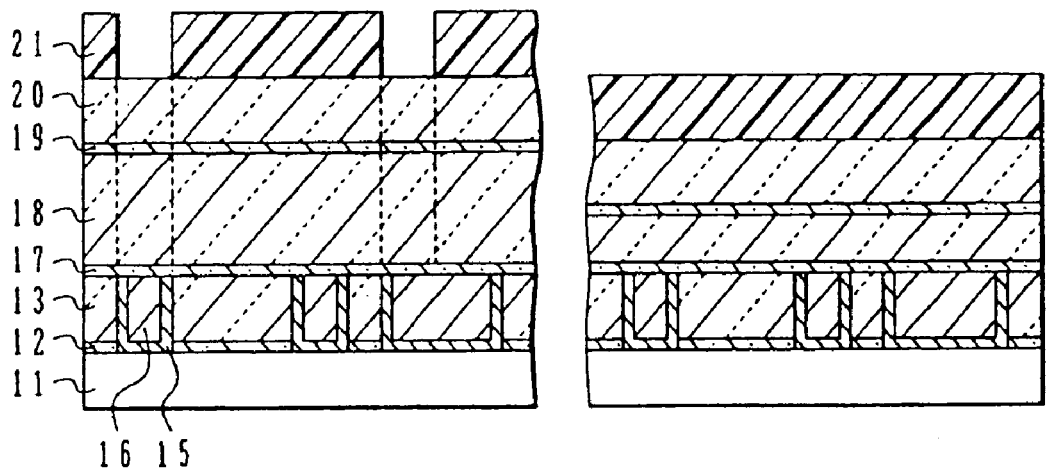
Figure 1D:
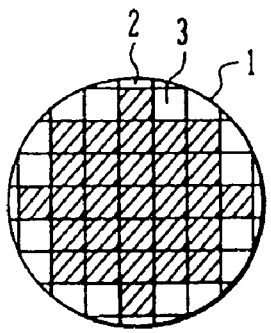

FIGS. 1A to 1I illustrate the main processes of a method of manufacturing a semiconductor wafer device according to an embodiment of the invention. FIGS. 1A to 1C are schematic cross sectional views of a semiconductor wafer, the left portion indicating the effective wafer area in which semiconductor circuits are formed, and the right portion indicating the noneffective wafer area in which effective circuits are not formed. The noneffective wafer area is also called a peripheral wafer area because it is disposed around the effective wafer area. Of the peripheral wafer area, an area having a constant width from the edge of the wafer is called a wafer edge area. FIG. 1D is a plan view of the semiconductor wafer.

As shown in FIG. 1A, a first etching stopper layer 12 is formed on an underlying structure 11, and a first insulating layer 13 is formed on the first etching stopper layer 12. For example, the underlying structure 11 is a structure having MOSFET's formed in active regions of the semiconductor wafer and an insulating film formed over MOSFET's and embedded with W plugs, or a structure having a higher level wiring layer with via conductors.

The first etching stopper layer 12 is made of, for example, an SiN layer of 50 nm thick and has an oxygen shielding function, an etching stopper function and a Cu diffusion preventing function. The first insulating film 13 is made of, for example, an $SiO_2$ layer of 500 nm thick. On the surface of the first insulating layer 13, a photoresist layer 14 having openings for wiring patterns (including conductor patterns not used as actual wiring) is formed.

By using the photoresist layer 14 as an etching mask, the first insulating layer 13 is etched by reactive ion etching (RIE) using CF-containing etching gas, this etching being stopped at the first etching stopper layer 12. Thereafter, the photoresist layer 14 is removed by ashing using $O_2$-containing gas plasma. During this ashing, since the underlying structure 11 is covered with the first etching stopper layer 12, the surface of conductors in the underlying structure is prevented from being oxidized. Thereafter, the first etching stopper layer 12 exposed in the wiring groove is removed by RIE using CHF-containing etching gas.

For example, the $SiO_2$ layer is etched by using mixed gas of $CF_4$ (or $C_4F_8$/Ar/$O_2$ as etchant, and the SiN layer is etched by using $CHF_3$/Ar/$O_2$ as etchant.

As shown in FIG. 1B, a first barrier metal layer 15 and a first main wiring layer 16 are formed on the structure with wiring grooves. For example, the barrier metal layer 15 is made of a Ta layer of 50 nm thick, and the main wiring layer 16 is made of a Cu layer of 1500 nm. The barrier metal layer 15 is formed by sputtering, and the main wiring layer 16 is formed by sputtering or plating. For example, if the main wiring layer 16 is formed by plating, first a Cu seed layer is formed by sputtering and then a Cu layer having the remaining thickness is formed on the Cu seed by plating. After the barrier metal layer 15 and main wiring layer 16 are formed, the main wiring layer 16 and barrier metal layer 15 on the surface of the first insulating layer 13 are removed by chemical mechanical polishing (CMP).

As shown in FIG. 1C, after the main wiring layer 16 and barrier metal layer 15 on the surface of the first insulating layer 13 are removed by CMP, a second etching stopper layer 17 is formed on the surface of the semiconductor wafer to protect the surface of the main wiring layer 16. For example, the second etching stopper layer 17 is made of an SiN layer of 50 nm thick. On the second etching stopper layer 17, a second insulating layer 18 made of, for example, an $SiO_2$ layer of 1200 nm thick is formed.

After the second insulating layer 18 is formed, CMP is performed to planarize the surface thereof. For example, if the second insulating film 18 in the effective wafer area is polished by a thickness of 500 nm to leave the layer of 700 nm thick, the second insulating layer 18 in the peripheral wafer area is polished by a thickness of 900 nm to leave the layer of 300 nm thick. Although the second insulating layer 18 of 700 nm thick is left in the effective wafer area, the insulating film 18 in the peripheral wafer area has a thickness which is a half or thinner than that in the effective wafer area.

After CMP, a third etching stopper layer 19 and a third insulating layer 20 are formed on the surface of the second insulating layer 18. For example, the third etching stopper layer is made of an SiN layer of 50 nm thick, and the third insulating layer 20 is made of an $SiO_2$ layer of 500 nm thick. On the surface of the third insulating layer 20, a photoresist layer 21 having openings for via conductor hole patterns is formed. The hole pattern is formed only in the effective wafer area, and not formed in the peripheral wafer area.

FIG. 1D is a plan view of the wafer 1. In the effective wafer area indicated by batched lines, hole patterns are formed, whereas in the peripheral wafer area 2 and 3 around the effective wafer area, hole patterns are not formed. Because hole patterns are not formed in the peripheral wafer area, it is possible to prevent the second etching stopper layer 17 from being etched and the main wiring layer 16 from being oxidized and decomposed.

Reverting to FIG. 1C, by using the photoresist layer 21 as an etching mask, the third insulating layer 20, third etching stopper layer 19 and second insulating layer 18 are etched by using CF-containing etching gas, CHF-containing etching gas or the like. This etching is stopped at the surface of the second etching stopper layer 17 by controlling the etching conditions.

Because hole patterns do not exist in the peripheral wafer area, the photoresist layer 21 protects the surface of the third insulating layer 20, and the underlying third etching stopper layer 19, second insulating layer 18 and second etching stopper layer 17 are left as they are.

Although hole patterns are formed only in the effective wafer area, the area occupied by the hole patterns is small so that the degree of unstable etching in the effective wafer area to be caused by the distribution of process parameters is small. After this etching, the photoresist layer 21 is removed by ashing using $O_2$ plasma.

Figure 1E:
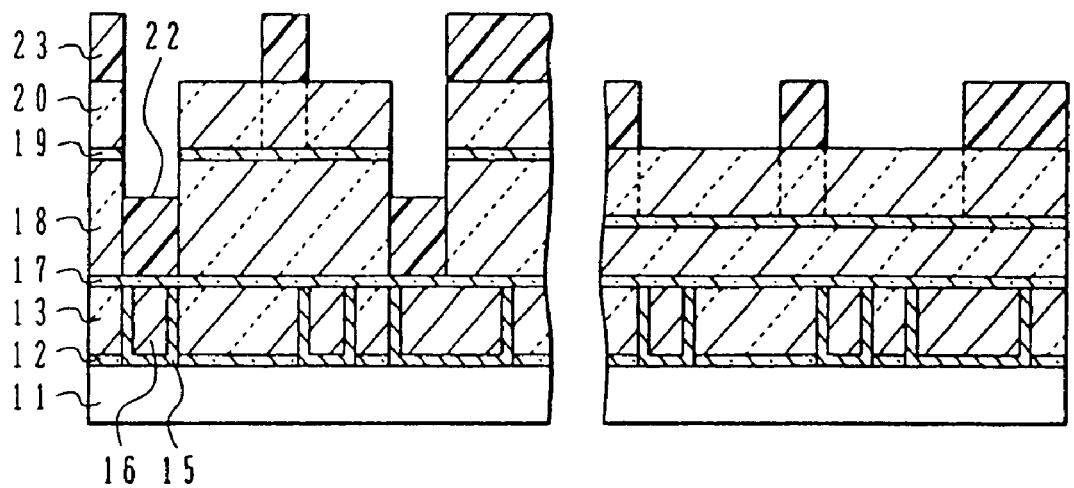

As shown in FIG. 1E, non-photosensitive resin is coated on the surface of the semiconductor wafer and melted from its surface to leave fillers 22 of non-photosensitive resin only in the via holes. Thereafter, a photoresist layer 23 having openings for wiring patterns (including conductor patterns) is formed on the surface of the third insulating layer 20.

The wiring patterns of the photoresist layer 23 are formed not only in the effective wafer area but also in the peripheral wafer area. Namely, by forming wiring patterns over the whole area of the wafer, it becomes possible to mitigate a degree of a distribution, in the wafer, of process parameters such as an etching rate and a polishing speed having the effect upon the effective wafer area.

Figure 1F:
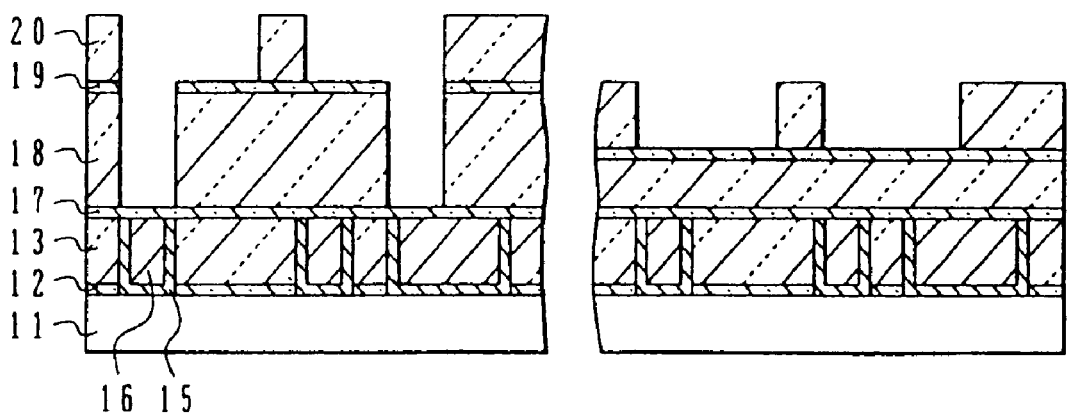
Figure 1G:
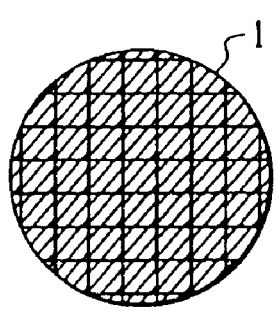

FIG. 1G is a plan view showing the area where the wiring patterns are formed in the semiconductor wafer 1, i.e., the whole area of the wafer.

Thereafter, by using the photoresist layer 23 as an etching mask, the third insulating layer 20 is etched by RIE using CF-containing etching gas. This etching progresses generally uniformly over the whole wafer area because the third insulating layer 20 has generally the same thickness over the whole wafer area, forms wiring grooves in the effective wafer area and peripheral wafer area, and stops at the surface of the third etching stopper layer 19. The surfaces of the main wiring layer 16 and barrier metal layer 15 in the peripheral wafer area are covered with the third etching stopper layer 19, second insulating layer 18 and second etching stopper layer 17 so that decomposition and oxidation can be prevented.

Figure 1H:
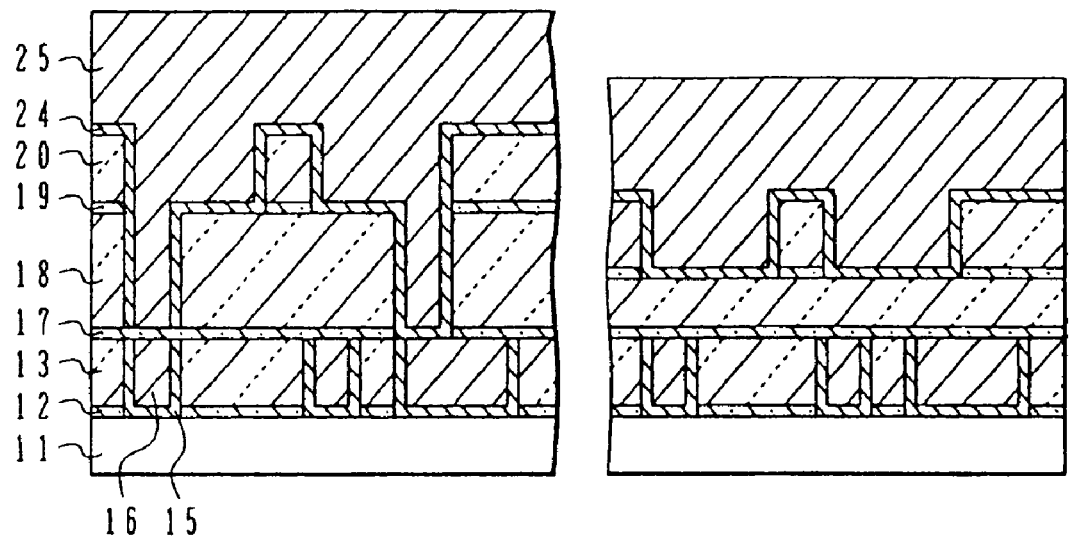

As shown in FIG. 1F, after the third insulating layer 20 is etched, the photoresist layer 23 is removed by ashing using $O_2$ plasma. The non-photosensitive resin fillers 22 are removed at the same time. The third etching stopper layer 19 exposed on the bottom of the wiring groove and the second etching stopper layer 17 exposed on the bottom of the via hole are removed by RIE using CHF-containing etching gas. As shown in FIG. 1H, a second barrier metal layer 24 and a second main wiring layer 25 are formed on the surface of the semiconductor wafer with wiring grooves and via holes. Similar to the first barrier metal layer 15 and first main wiring layer 16, the barrier metal layer is formed by sputtering and the main wiring layer is formed by sputtering or plating. Thereafter, the second main wiring layer 25 and second barrier metal layer 24 deposited on the surface of the third insulating layer 20 are removed by CMP.

Figure 1I:
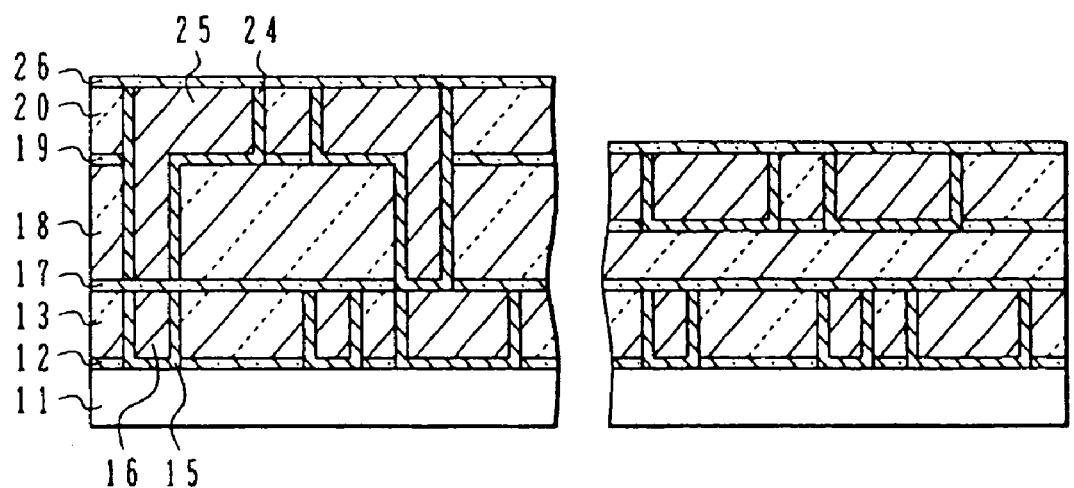

As shown in FIG. 1I, a fourth etching stopper layer 26 is formed on the surface of the semiconductor wafer, covering the second main wiring layer 25 after CMP. If the second main wiring layer is the uppermost wiring layer, a surface protective layer is formed in place of the etching stopper layer.

With the above processes, in the effective wafer area, wiring layers of the dual damascene structure are formed, and in the peripheral wafer area, a single damascene structure with only conductor patterns not functioning as wiring is formed. Because the single damascene structure with only conductor patterns not functioning as wiring is formed in the peripheral wafer area, it is possible to prevent the surface of the underlying conductor patterns from being oxidized or decomposed.

The multi-layer wiring of the dual damascene structure has been described above. A similar structure can be adopted for the single damascene wiring structure.

FIGS. 2A to 2G are cross sectional views of a semiconductor wafer illustrating the main processes of a method of manufacturing a single damascene structure according to another embodiment of the invention. In FIGS. 2A to 2G, like elements to those of the embodiment shown in FIGS. 1A to 1I are represented by using identical reference numerals and the detailed description thereof is omitted.

Figure 2A:
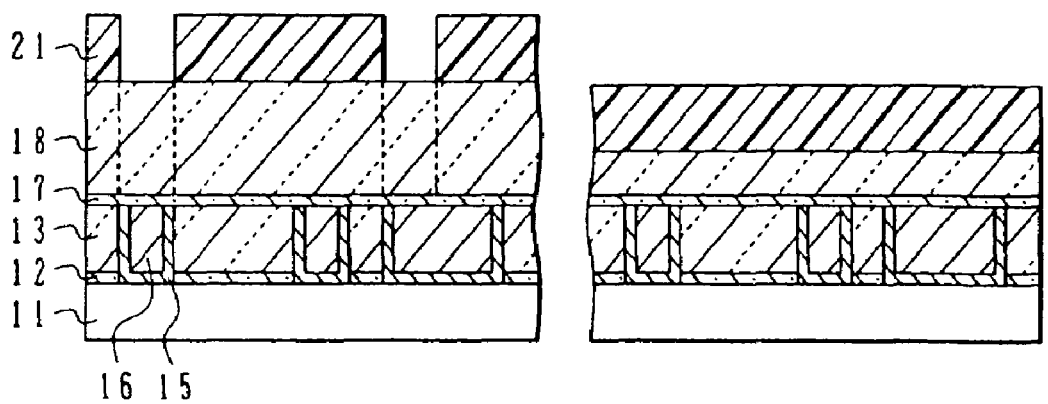
FIGS. 2A to 2G are cross sectional views illustrating the manufacture processes for a semiconductor wafer device according to another of the invention.

As shown in FIG. 2A, on an underlying structure 11, a first etching stopper layer 12 and a first insulating layer 13 are formed, and wiring patterns made of a first barrier metal layer 15 and a first main wiring layer 16 are embedded in the first insulating layer 13 and first etching stopper layer 12. Thereafter, a second etching stopper layer 17 and a second insulating layer 18 are formed on the surface of the semiconductor wafer, and the surface of the second insulating layer is planarized by CMP. CMP has a tendency that the thickness of the second insulating layer 18 in the peripheral wafer area becomes thinner then the thickness of the second insulating layer 18 in the effective wafer area. On the surface of the second insulating layer 18 after CMP, a photoresist layer 21 having openings for via hole patterns is formed. The photoresist layer 21 has via hole patterns only in the effective wafer area, and does not have openings in the peripheral wafer area.

Figure 2B:
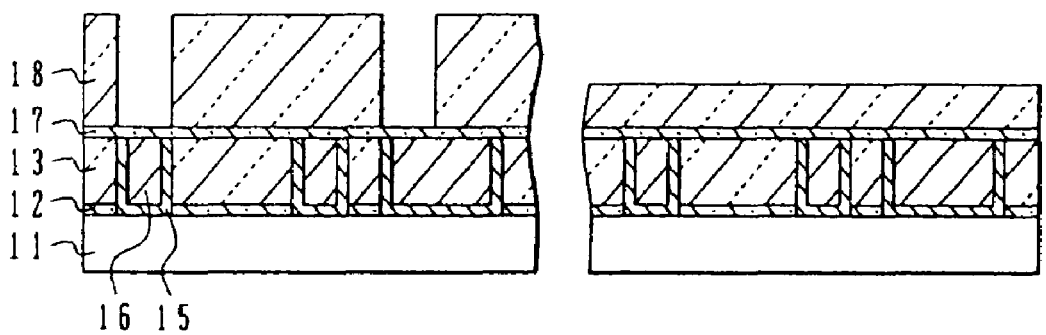

As shown in FIG. 2B, by using the photoresist layer 21 as an etching mask, the second insulating layer 18 is etched by RIE using CF-containing gas or the like, and this etching stops at the surface of the second etching stopper layer 17. Because via holes are not formed in the peripheral wafer area, the second insulating layer 18 is left as it is. The photoresist layer 21 is thereafter removed by ashing using $O_2$ gas plasma. After the photoresist layer is removed, the second etching stopper layer 17 exposed on the bottom of each via hole is removed by RIE using CHF-containing etching gas.

Figure 2C:
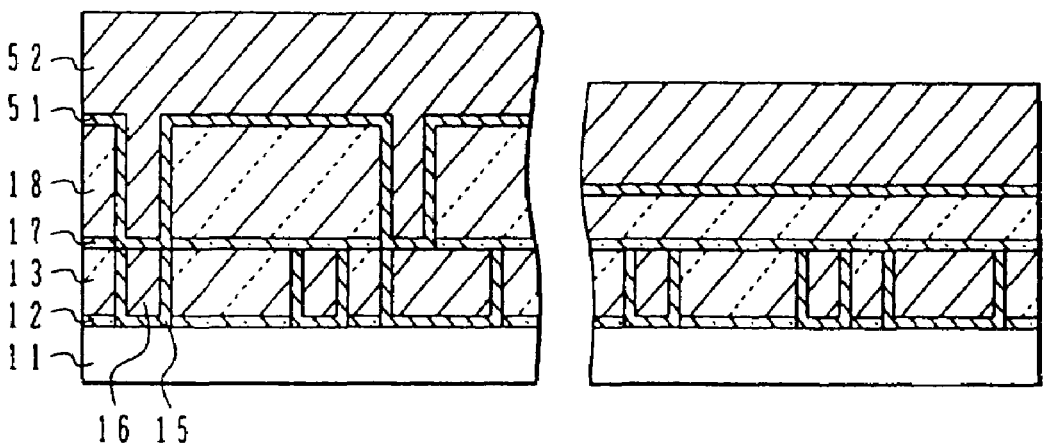

As shown in FIG. 2C, a second barrier metal layer 51 and a second main wiring layer 52 are formed by sputtering, plating or the like on the surface of the semiconductor wafer formed with via holes. Thereafter, unnecessary regions of the second main wiring layer 52 and second barrier metal layer 51 on the surface of the second insulating layer 18 are removed by CMP.

Figure 2D:
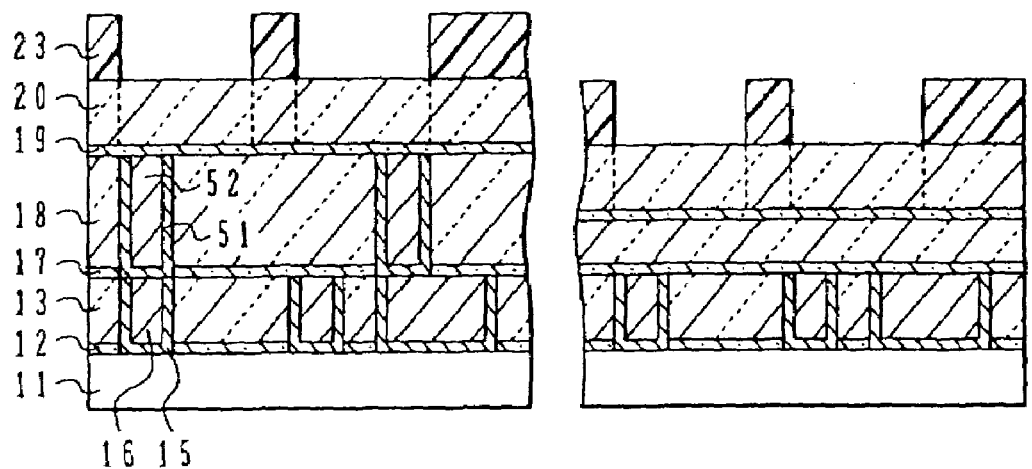

As shown in FIG. 2D, a third etching stopper layer 19 is formed on the surface of the second insulating layer 18, covering the surfaces of the second main wiring layer 52 and second barrier metal layer 51 embedded in the second insulating layer 18 by CMP. A third insulating layer 20 is formed on the third etching stopper layer 19. On the surface of the third insulating layer 20, a photoresist layer 23 having openings for wiring patterns is formed. The photoresist layer 23 has openings for wiring patterns in the effective wafer area, and openings for conductor patterns not used as wiring in the peripheral wafer area.

By using the photoresist layer 23 as an etching mask, the third insulating layer 20 is etched by RIE.

Figure 2E:
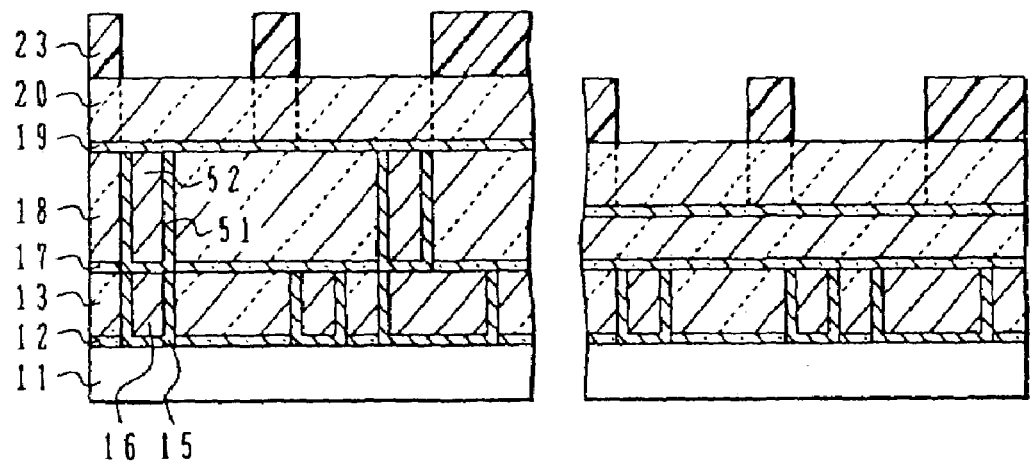

As shown in FIG. 2E, after wiring pattern grooves are formed in the effective wafer area and conductor pattern grooves are formed in the peripheral wafer area, the photoresist layer 23 is removed by ashing using $O_2$ gas plasma. Thereafter, the third etching stopper layer 19 exposed in the grooves is removed by RIE using CHF-containing etching gas or the like.

Figure 2F:
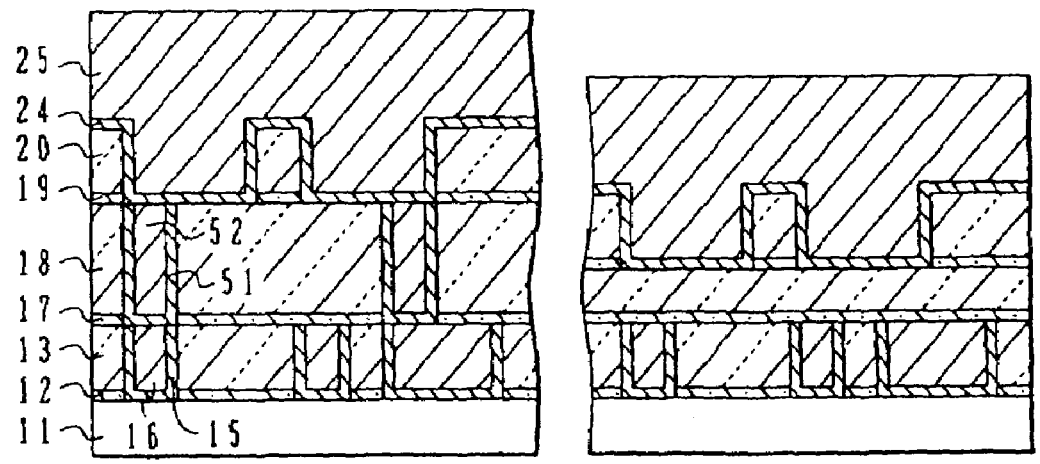

As shown in FIG. 2F, on the third insulating layer 20 formed with wiring grooves, a third barrier metal layer 24 and a third main wiring layer 25 are formed. Thereafter, unnecessary regions of the third main wiring layer 25 and third barrier metal layer 24 deposited on the surface of the third insulating layer 20 are removed by CMP.

Figure 2G:
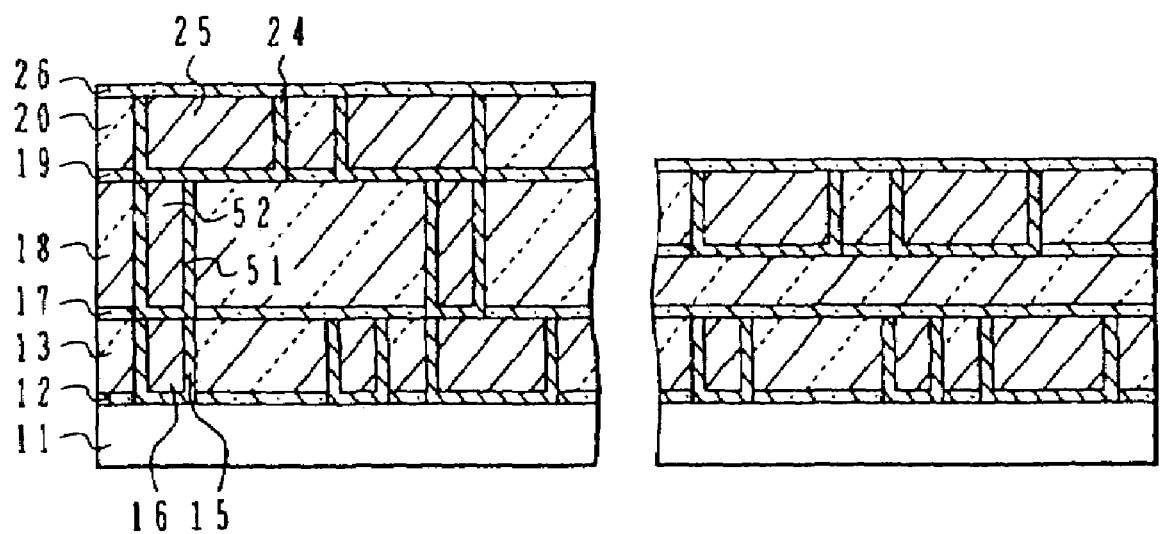

As shown in FIG. 2G, after the unnecessary regions of the third main wiring layer 25 and third barrier metal layer 24 on the third insulating layer 20 are removed, a fourth etching stopper layer 26 is formed on the third insulating layer 20, covering the surface of the third main wiring layer 25. If the third main wiring layer 25 is the uppermost wiring layer, a surface protective film is formed in place of the etching stopper layer.

With the above processes, a single damascene structure with via conductors and wiring patterns is formed in the effective wafer area, and a single damascene structure with only conductor patterns and without via conductors is formed in the wafer edge area. In the above embodiments, SiN is used as the material of the etching stopper layer, and silicon oxide is used as the material of the insulating latter. In order to reduce a capacitance of a wiring, an insulating layer of a low dielectric constant can be used. However, a low dielectric constant insulating layer has generally a low density and the characteristics that liquid and gas are transmitted or absorbed. From this reason, it is difficult to form an insulating layer of the multi-layer wiring structure only by using an insulating film of a low dielectric constant. It is preferable to mixedly use an insulating layer having a strong wiring protection function such as silicon oxide.

FIGS. 3A to 3I illustrate the manufacture processes for a damascene wiring structure using an insulating film made of coating type hydrocarbon-containing organic insulating material such as SiLK (trademark of Dow Corning Company) as the low dielectric constant insulating material.

Figure 3A:
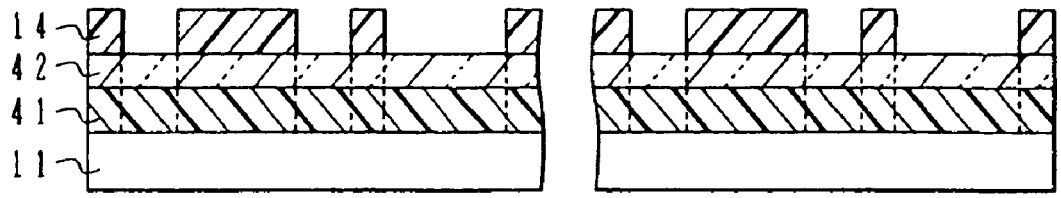
FIGS. 3A to 3I are cross sectional views illustrating the manufacture processes for a semiconductor wafer device according to another of the invention.
Figure 3B:
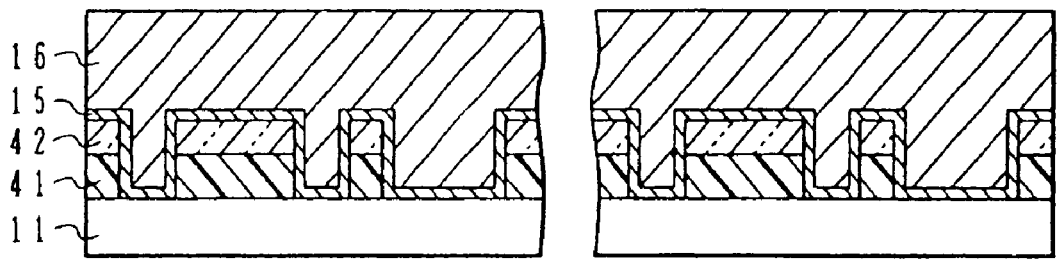

As shown in FIG. 3A, on the surface of an underlying structure 11 similar to the above-described embodiment, an insulating layer 41 made of coating type hydrocarbon-containing organic insulating material is formed, for example, by spin-coating the material to a thickness of 250 nm and curing the material by heat treatment for about 30 minutes at 400° C. On the cured organic insulating film 41, a silicon oxide layer 42 having a thickness of, for example, 250 nm is formed by plasma CVD or the like. The silicon oxide film and the coating type organic insulating layer have different etching characteristics so that etching can be controlled without inserting an etching stopper layer therebetween.

On the silicon oxide layer 42, a photoresist layer 14 having openings for wiring patterns is formed. The photoresist layer 14 has openings for wiring patterns in the effective strafer area, and openings for conductor patterns not used as wiring in the peripheral wafer area.

By using the photoresist layer 14 as an etching mask, the silicon oxide layer 42 is etched by RIE using CF-containing etching gas or the like. Next, by using the silicon oxide layer 42 as a mask, the organic insulating film 41 is etched by using plasma of $N_2$-containing gas, $H_2$-containing gas or the like. With this etching, the photoresist layer 14 is also removed.

As shown in FIG. 13B, on the semiconductor wafer formed with wiring grooves and conductor grooves, a first barrier metal layer 15 and a first main wiring layer 16 are formed. For example, the barrier metal layer 15 is made of a Ta layer of 50 nm thick, and the main wiring layer 16 is made of a Cu layer of 1500 nm. Thereafter, CMP is performed to remove unnecessary regions of the main wiring layer 16 and barrier metal layer 15 on the surface of the silicon oxide layer 42.

Figure 3C:
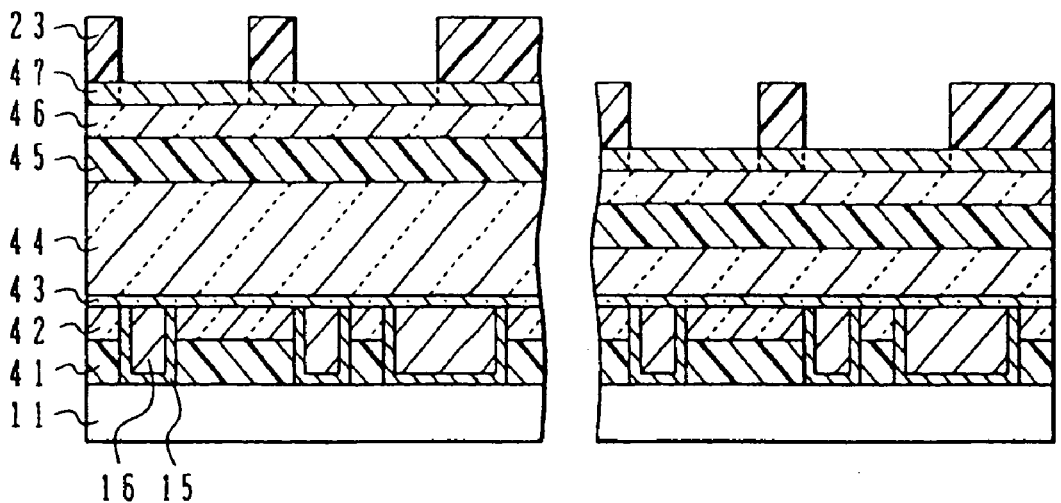

As shown in FIG. 3C, a first etching stopper layer 43 is formed on the surface of the silicon oxide film 42, covering the surface of the exposed first main wiring layer 16, and a first insulating layer 44 is formed on the first etching stopper layer 43. For example, the first etching stopper layer is made of an SIN layer of 50 nm thick, and the first insulating layer 44 is made of an $SiO_2$ layer of 1200 nm. After the first insulating layer 44 is formed, CMP is performed to planarize the surface thereof. With this CMP, the first insulating layer 44 having the remaining film thickness of about 700 nm is left in the effective wafer area, and the first insulating layer 44 having the remaining film thickness of about 300 nm is left in the peripheral wafer area.

Thereafter, on the surface of the first insulating layer 44, an organic insulating layer 45, a second insulating layer 46, and a metal layer 47 are formed. For example, the organic insulating layer 45 is made of an SiLK layer having a thickness of about 250 nm, the third insulating layer 46 is made of a silicon oxide layer having a thickness of about 250 nm, and the metal layer 47 is made of a TiN layer having a thickness of 100 nm. The metal layer 47 is used as a layer for forming later a hard mask.

On the metal layer 47, a photoresist layer 23 having openings for wiring patterns and conductor patterns is formed. By using the photoresist layer 23 as an etching mask, the metal layer 47 is etched by RIE using Cl-containing etching gas or the like. Thereafter, the photoresist layer 23 is removed by ashing using $O_2$ gas plasma.

Figure 3D:
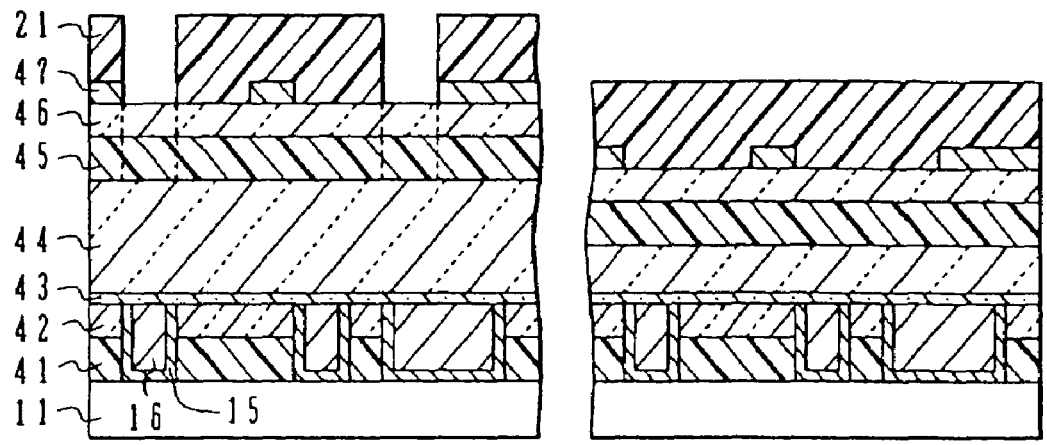

As shown in FIG. 3D, on the surface of the third insulating layer 46 having patterns of the metal layer 47 thereon, a photoresist layer 21 having openings for hole patterns is formed. Hole patterns are formed only in the effective wafer area and not formed in the peripheral wafer area.

By using the photoresist layer 21 as an etching mask, the second insulating layer 46 is etched by RIE using CF-containing etching gas or the like. Thereafter, by using the second insulating layer 46 as an etching gas, the organic insulating film 45 is etched by RIE using $N_2$-containing gas or $H_2$-containing gas as etching gas. When this organic insulating film 45 is etched, the photoresist layer 21 is removed at the same time.

Figure 3E:
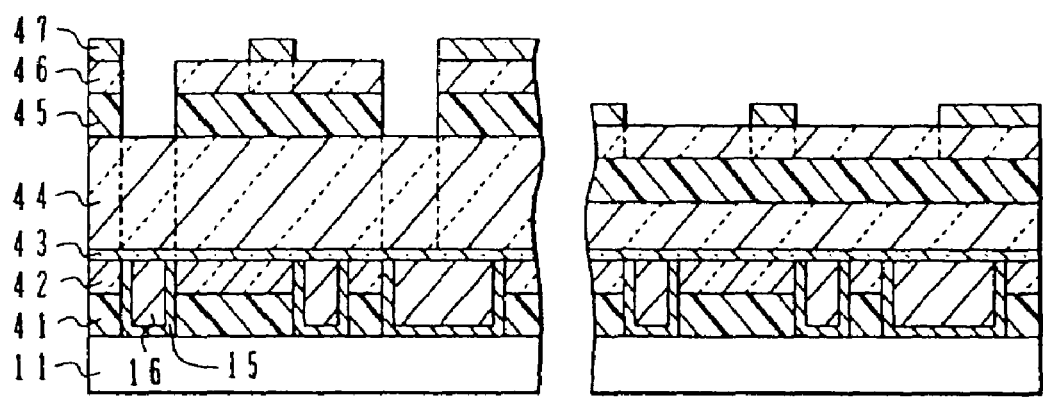

FIG. 3E shows the structure obtained by the above processes. Next, by using the metal layer 47 as an etching mask, the exposed second insulating layer 46 as well as the first insulating layer 44 exposed on the bottom of each hole pattern is etched by RIE using CF-containing gas.

Figure 3F:
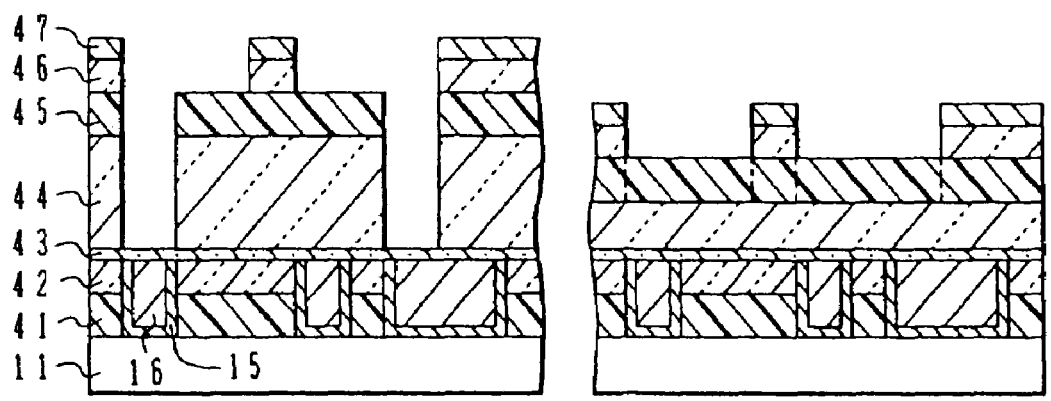

FIG. 3F shows the structure obtained by the above process. The organic insulating film 45 exposed in the upper area is etched by RIE using $N_2$-containing gas, $H_2$-containing gas or the like. The first etching stopper layer 43 is exposed on the bottom of each opening for a via hole. The exposed first etching stopper layer 43 is removed by RIE using CHF-containing etching gas or the like. Either one of these two etching processes may be performed first.

Figure 3G:
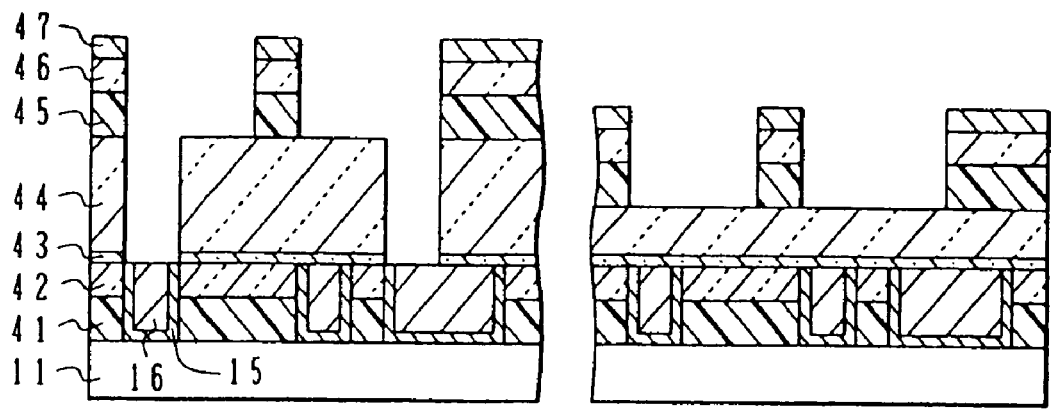

FIG. 3G shows the structure obtained by the above processes. The surface of the first main wiring layer 16 is exposed on the bottom of the via hole in the effective wafer area. Via holes do not exist in the peripheral wafer area and the surface of the first wiring layer 16 is covered with the first insulating layer 44 and first etching stopper layer 43.

Figure 3H:
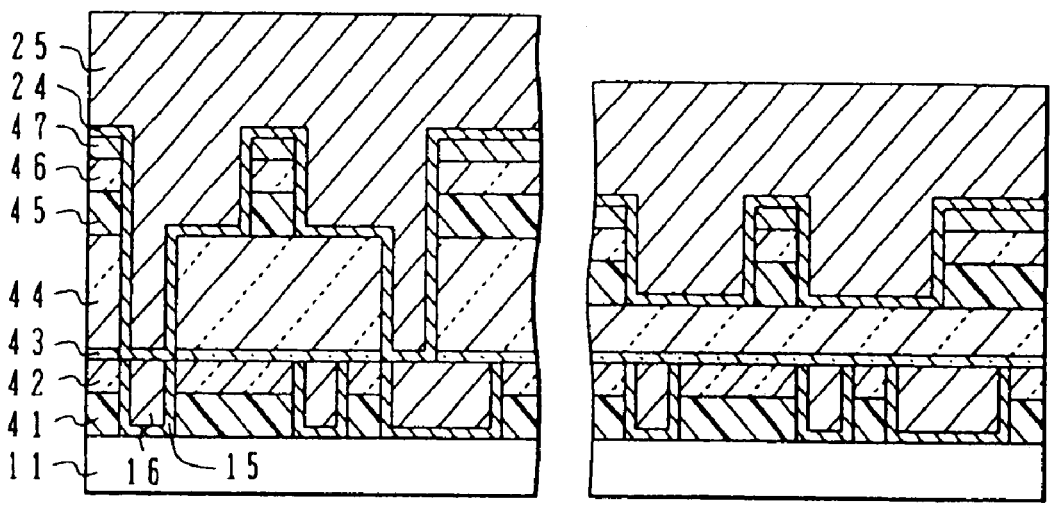

As shown in FIG. 3H, on the surface of the semiconductor wafer formed with wiring grooves, conductor grooves and via holes, a second barrier metal layer 24 and a second main wiring layer 25 are formed. For example, the second barrier metal layer 24 is made of a Ta layer of 50 nm thick, and the second main wiring layer 25 is made of a Cu layer of 1500 nm thick.

Thereafter, CMP is performed to remove the unnecessary regions of the second main wiring layer 25, second barrier metal layer 24 and metal layer 47 on the surface of the second insulating layer 46.

Figure 3I:
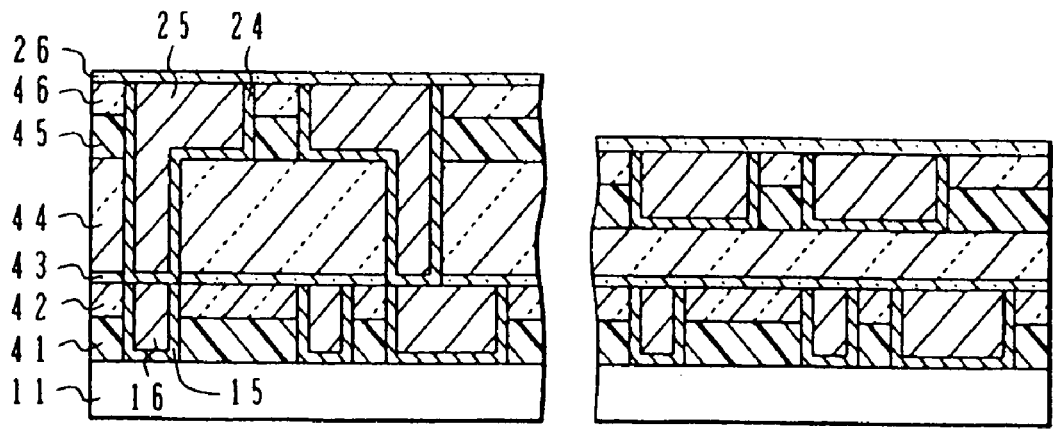

As shown in FIG. 3I, an etching stopper layer 26 is formed on the surface of the second insulating layer 46, covering the exposed second main wiring layer 25. If the second main wiring layer 25 is the uppermost wiring layer, a surface protective film is formed in place of the etching stopper layer.

With the above processes, it is possible to form the wiring structure having an interlevel insulating film made of an organic insulating film. A dual damascene wiring structure is formed in the effective wafer area, and a single damascene structure having only conductor patterns is formed in the peripheral wafer area.

The manufacture processes for forming a partial structure of a multi-layer wiring structure has been described above. The multi-layer wiring structure may have the desired number of wiring layers. In the following, an example of the multi-layer wiring structure will be described.

FIG. 4 is a schematic diagram showing the structure of a semiconductor wafer device having the multi-layer wiring structure. The left portion in FIG. 4 shows the structure in the effective wafer area, and the right portion shows the structure in the peripheral wafer area. In a predetermined area of a semiconductor wafer formed with wells, element separation trenches are formed in which insulating material is filled to form shallow trench isolation (STI) regions 4.

On an active region defined by STI, an insulated gate electrode 5 and a side wall spacer 6 are formed, and on both sides of the gate electrode, source/drain regions S/D are formed through ion implantation. A first etching stopper layer s1 is formed covering the insulated gate electrode, and a first lower insulting layer da1 is formed on the first etching stopper layer s1. A conductive plug is formed through the first lower insulating layer da1 and first etching stopper layer s1, the conductive plug being constituted on a barrier metal layer 7 and a wiring metal region 8.

Although FIG. 4 shows that the contact holes are formed in the peripheral wafer area to embed the plugs in these holes, plugs may not be formed in the peripheral wafer area. If plugs are formed in the peripheral wafer area, it is preferable not to perform planarization by CMP immediately after interlevel insulating films cd1 and db1 are formed just upon the first lower insulating layer. If plugs are not formed in the peripheral wafer area, planarization by CMP may be performed after the interlevel insulating films cd1 and db1 are formed just upon the first lower insulating layer.

On the first, lower insulating film da1, an organic insulating film cd1 and first upper insulating layer db1 are formed. If the organic insulating film is of a coating type, it has a planarizing function so that a flat surface can be obtained without CMP. Wiring grooves are formed through the first upper insulating layer db1 and organic insulating layer cd1 and a first wiring layer 9 is filled therein.

A second etching stopper layer s2 is formed on the surface of the first wiring layer 9, and a second lower insulating layer da2 is formed on the surface of the second etching stopper layer s2. The second lower insulating layer da2 is planarized by CMP and left thick in the effective wafer area and thin in the peripheral wafer area. On the second lower insulating layer da2, a second organic insulating film cd2 and a second upper insulating layer db2 are formed. A dual damascene wiring structure dd1 is therefore formed in the effective wafer area, and a single damascene wiring structure sd1 with only conductor patterns are formed in the wafer edge area.

Similarly, a third etching stopper layer s3 and a third lower insulating layer da3 are formed on the surface of the second upper insulating layer db2, and the surface of the third lower insulating layer da3 is planarized by CMP. On this flat surface, a third organic insulating film cd3 and a third upper insulating layer db3 are formed. A second dual damascene wiring structure dd2 and a second single damascene wiring structure sd2 with only conductor patterns are therefore embedded in the effective wafer area and in the wafer edge area, respectively.

Further, a fourth etching stopper layer s4 and a fourth lower insulating layer da4 are formed on the surface of the third upper insulating layer db3, and the surface of the fourth lower insulating layer da4 is planarized by CMP. On this flat surface, a fourth organic insulating film cd4 and a fourth upper insulating layer db4 are formed. A third dual damascene wiring structure dd3 and a third single damascene, wiring structure sd3 with only conductor patterns are therefore embedded in the effective wafer area and in the wafer edge area, respectively. On the surface of this wiring structure, a surface protective film cv is formed.

Although the four-layer wiring structure has been described, the number of wiring layers can be increased or reduced as desired. In place of a lamination of the organic insulating film and upper insulating layer, a lamination of an etching stopper layer and an insulating layer may be used. A laminated insulating layer including a low dielectric constant insulating layer such as a silicon oxide layer containing fluorine or carbon and a porous silicon oxide layer may also be used. It is obvious to those skilled in the art that other structures of the interlevel insulating film may be used.

It has been found that a new problem occurs if a coating type organic insulating film such as SiLK is used as part of the interlevel insulating film. A coating type insulating film and a photoresist layer have a thickness in the wafer edge area different from a thickness in the central wafer area, and may become in contact with a cassette or the like during transportation thereof. It is general therefore to remove a coated film in the wafer edge area by rinsing or peripheral exposure. This process will be described with reference to FIGS. 5A to 5D.

Figure 5A:
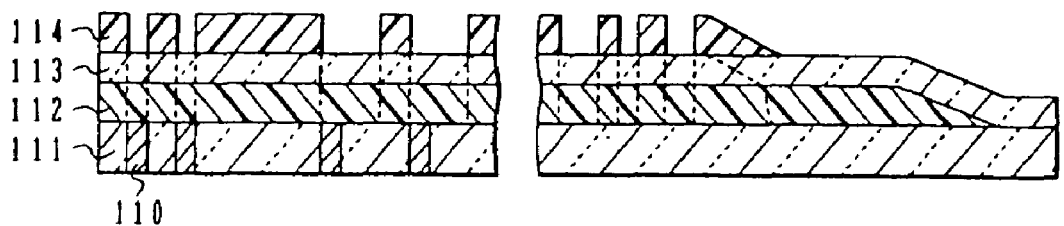
FIGS. 5A to 5D are cross sectional views explaining problems which occur when a coating type insulating layer is used.

As shown in FIG. 5A, on an underlying structure 111, an organic insulating film 112 made of, for example, SiLK, is coated to a thickness of 250 nm. For example, the underlying structure 111 is a structure that conductive plugs 110 are embedded in the first lower insulating layer da1 shown in FIG. 4. Conductive plugs 110 are not formed in the wafer edge area. Coated material in the peripheral wafer area is removed by rinsing using etchant by about 3±0.0.5 mm from the wafer edge. Next, an insulating film 113 made of, for example, a silicon oxide film of about 250 nm thick, is deposited by CVD to cover the whole surface of the organic insulating layer 112.

On the insulating layer 113, a photoresist layer 114 having openings for wiring patterns is formed. The peripheral area of the photoresist layer 114 is removed by about 5±0.0.5 mm from the wafer edge.

By using the photoresist layer 114 as an etching mask, the insulating layer 113 is etched by RIE using CF-containing etching gas or the like. Next, by using the patterned insulating layer 113 as a mask, the organic insulating layer 112 is etched by RIE using $H_2$-containing or $N_2$-containing etching gas or the like. In this case, the photoresist layer 114 is etched at the same time. In each etched wiring groove (including each groove for the conductor pattern), the side wall of the organic insulating layer 112 is exposed. At the same time, the outermost side wall of the organic insulating layer 112 is exposed.

The semiconductor wafer is subjected to atmospheric pressure annealing at 400° C. in an atmosphere of $H_2/N_2$ to remove adsorbents on the organic insulating layer and the like.

Figure 5B:
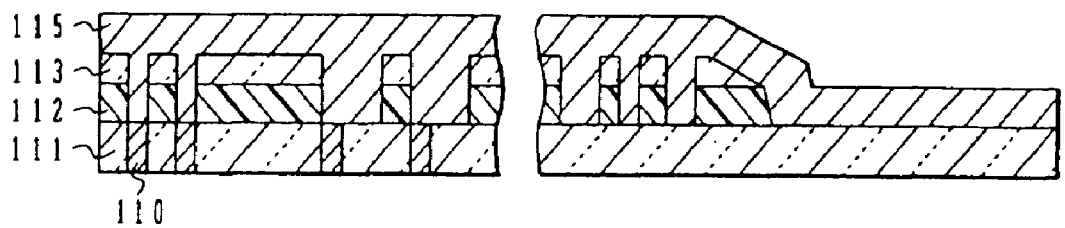
Figure 5C:
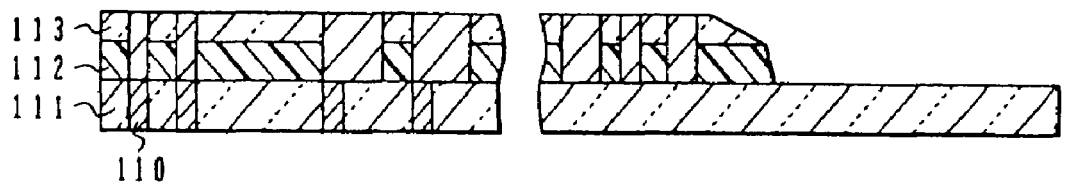

As shown in FIG. 5B, a wiring layer 115 of a barrier metal layer and a main wiring layer is formed being filled in the wiring grooves. For example, a Cu layer of 1500 nm thick is used as the main wiring layer. As shown in FIG. SC, an unnecessary wiring layer deposited on the insulating layer is removed by CMP. With this CMP, the peripheral wafer area is strongly over-polished more than the central wafer area so that the wiring layer outside the outermost side wall of the insulating layer is removed. The polishing speed of CMP is decided by a pressure distribution, a chemical etching rate relative to chemicals in slurry, and the like. Generally, a polishing speed is higher in the peripheral wafer area than in the central wafer area.

In the wafer edge area, the side wall of the organic insulating layer 112 is exposed so that water contents contained in chemicals such as slurry used by CMP, organic substances contained in the air and the like are attached to the exposed side wall. There is a possibility that chemicals are impregnated into the interface or the like between the underlying structure 111 and organic insulating layer 112 if HF-containing chemicals are used at a later process or the like.

Figure 5D:
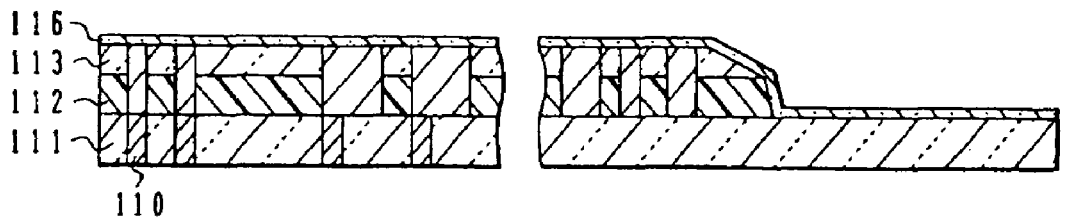

As shown in FIG. 5D, an etching stopper layer 116 is formed covering the wiring layer 115, the etching stopper layer 116 providing a function of Cu diffusion prevention, etching stopper for a later etching process, oxygen shielding and the like. For example, a silicon nitride layer of 50 nm thick is used as the etching stopper layer 116.

If mixed gas of $NH_3$-containing gas, $SiH_4$-containing gas and the like is used for forming the silicon nitride film, the exposed surface of the silicon nitride film 112 is etched or decomposed in some cases. Similar etching or decomposition may occur if $NH_3$ gas plasma is used to reduce oxide on the surface of the Cu wiring layer before the silicon nitride layer is deposited.

If water content, organic substances or the like are attached to the organic insulating layer 112 or its interface, there is a possibility that the organic insulating layer 112 degasses during a later insulating film forming process, heat treatment or the like so that the adhesion of the interface lowers and a film peel-off occurs. The peel-off of the film may reach the central wafer area, raising the percentage of defective devices.

As the organic insulating film is exposed in the wafer edge area, water contents, organic substances or the like are attached to the exposed surface. The organic insulating film may be peeled off at its interface at a later heat treatment or the like or may be etched or decomposed by gas used for forming the diffusion prevention and etching stopper film covering the wiring layer. This results in an increase of the percentage of defective devices in the peripheral wafer area and generation of particles by peel-off. The percentage of defective semiconductor devices in the effective wafer area increases as the second stage.

FIGS. 6A to 6D illustrate the main processes of a method of manufacturing a semiconductor wafer device solving the above problem, according to an embodiment of the invention. FIGS. 7A to 7D are plan views illustrating the processes shown in FIGS. 6A to 6D in terms of a wafer plan view.

Figure 6A:
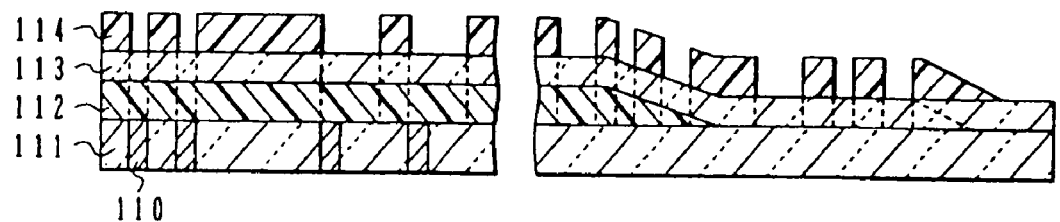
FIGS. 6A to 6D are cross sectional views illustrating the manufacture processes for a semiconductor wafer device according to another embodiment of the invention.

As shown in FIG. 6A, on an underlying structure 111 similar to that shown in FIG. 5A, an organic insulating film 112 of SiLK or the like is coated to a thickness of about 250 nm. The organic insulating layer 112 coated in the peripheral wafer area is removed by etchant by about 5±0.0.5 mm from the wafer edge.

Figure 7A:
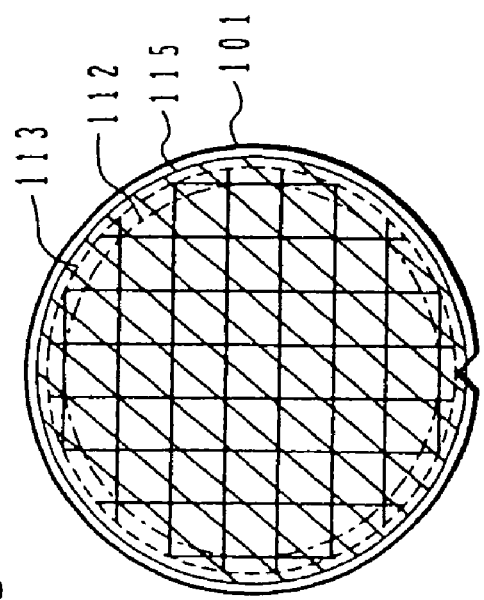
FIGS. 7A to 7D are plan views showing the layouts corresponding to the processes shown in FIGS. 6A to 6D.

FIG. 7A shows the state that the organic insulating layer 112 is retracted from the edge of the semiconductor wafer 101 by a constant distance by the process shown in FIG. 6A.

Next, an insulating layer 113 made of, for example, a silicon oxide layer of 250 nm thick, is deposited by CVD, covering the organic insulating layer 112. A photoresist layer 114 having openings for wiring patterns is formed on the surface of the insulating layer 113. The photoresist layer has openings for wiring patterns in the effective wafer area and openings for conductor patterns in the wafer edge area. Openings for conductor patterns distribute from the area under which the organic insulating layer 112 exists to the area without the organic insulating layer 112.

In the wafer edge area, the photoresist layer 114 is removed by 3±0.0.5 mm from the wafer edge. The photoresist layer may be removed either by using resist peel-off agent or by exposure and development. Either case is called removing a resist edge portion by peripheral exposure.

Figure 7C:
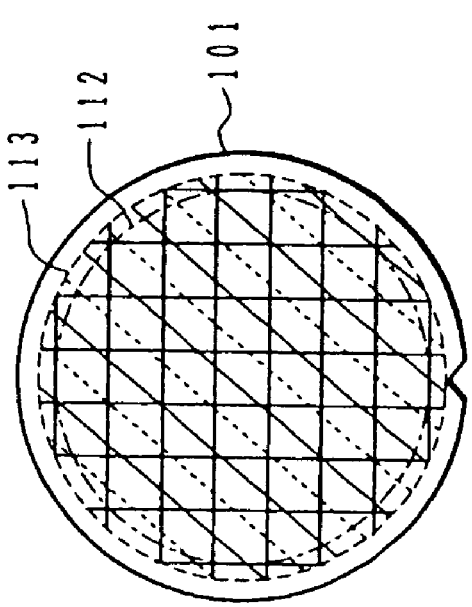
Figure 7B:
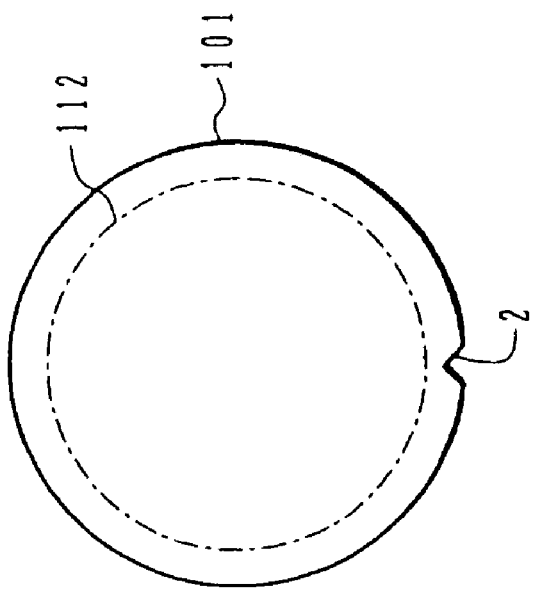

FIG. 7B shows the state that the insulating layer covering the side wall of the organic insulating layer 112 is formed and the photoresist layer 114 for etching the insulating layer is formed on the insulating layer. The outer periphery of the photoresist layer 114 positions outside the organic insulating layer 112.

By using the photoresist layer 114 as an etching mask, the insulating layer 113 is etched by RIE using CF-containing gas or the like. In the wafer edge area, there is an area where the organic insulating layer 112 does not exist. if the underlying structure 111 is a silicon oxide film or the like, there is a possibility that the surface of the underlying structure 111 is etched. However, circuits are not formed in this area so that there is no practical problem.

By using the patterned insulating layer 113 as an etching mask, the organic insulating layer 112 is etched by RIE using $H_2$-containing gas, $N_2$-containing gas or the like. With this etching, the photoresist layer 114 is also removed at the same time. The side wall of the organic insulating layer 112 is exposed in the lower area of the wiring groove.

The semiconductor wafer is subjected to atmospheric pressure annealing, for example, at 400° C. in an atmosphere of $H_2/N_2$ to remove adsorbents on the exposed surface of the organic insulating layer 112.

Figure 6B:
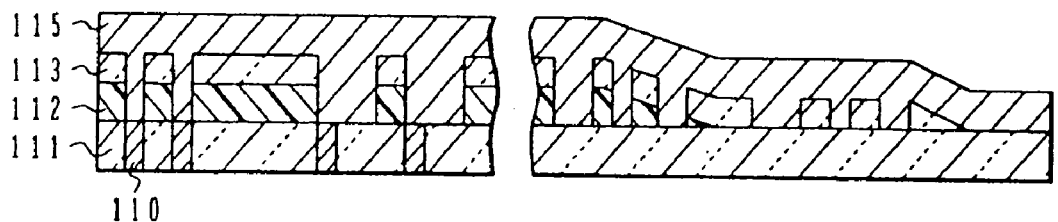

As shown in FIG. 6B, a wiring material layer 115 is formed on the semiconductor wafer, being filled in the wiring grooves. For example, a Cu layer of 1500 nm thick is used as the main wiring layer. The wiring layer 115 formed may be removed, for example, by about 1.0±0.0.5 mm from the wafer edge. In this case, a possibility of peel-off by CMP lowers.

FIG. 7C shows the state that the wiring material layer 115 is formed. The wiring material layer 115 exists up to a position slightly retracted from the edge of the semiconductor wafer 111, and exists outside the organic insulating layer 112 and insulating layer 113.

Figure 6C:
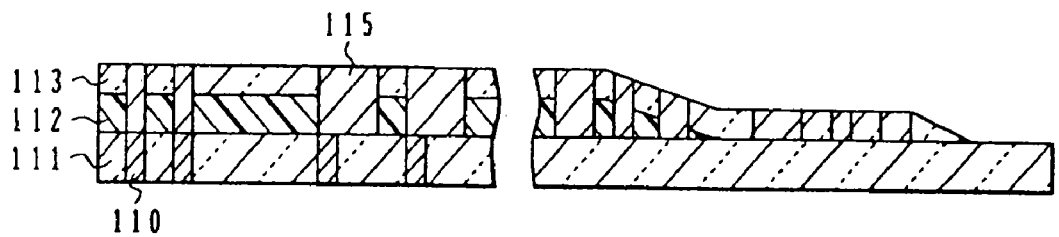

As shown in FIG. 6C, the surface of the semiconductor wafer is subjected to CMP to remove the wiring material layer 115 deposited on the surface of the insulating layer 113. The wiring material layer 115 is left in the wiring grooves (conductor grooves). The whole surface of the organic insulating layer 112 is covered with the insulating layer 113 so that the organic insulating layer 112 is not exposed by CMP. The wiring material layer may be left in the wafer edge area.

Figure 7D:
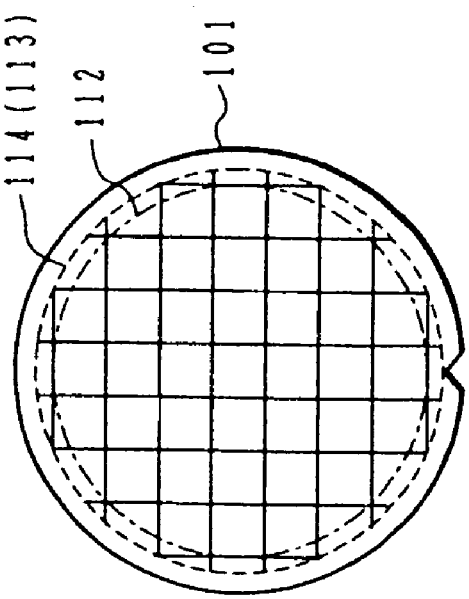

FIG. 7D shows the state after CMP. Even after CMP, the organic insulating layer 112 is being covered with the insulating layer 113.

Figure 6D:
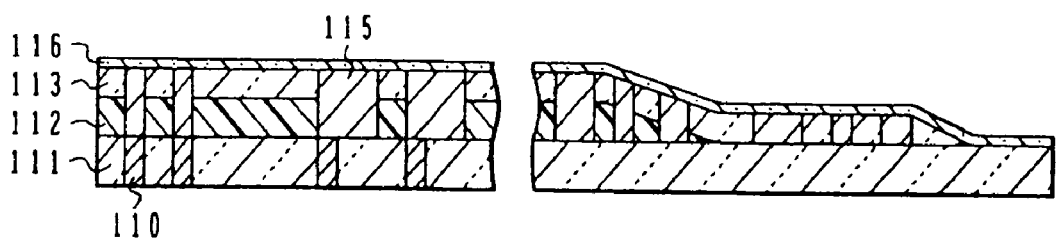

As shown in FIG. 6D, a diffusion prevention and etching stopper layer 116 is formed covering the surface of the insulating layer 113 embedded with the wiring layer 115. For example, a silicon nitride layer of about 50 nm thick is used as the etching stopper layer 116. Even if $NH_3$ gas is used for forming the etching stopper layer 116, the organic insulating layer 112 is not etched nor decomposed because the surface of the organic insulating layer is not exposed.

The underlying structure 111 may be a structure of the insulating layer 18 embedded with via conductors 51 and 52 shown in FIG. 2D. The upper etching stopper layer 19 is formed if necessary. If the etching stopper layer 19 is formed, an etching process of removing the etching stopper layer is performed succeeding to the etching process for the organic insulating layer shown in FIG. 6A.

Instead of SiLK as a low dielectric constant insulating layer, inorganic silicon compound such as hydrogen silsesquioxane resin (HSQ), a coating type insulating layer such as a porous inorganic silicon oxide film may also be used.

Figure 8A:
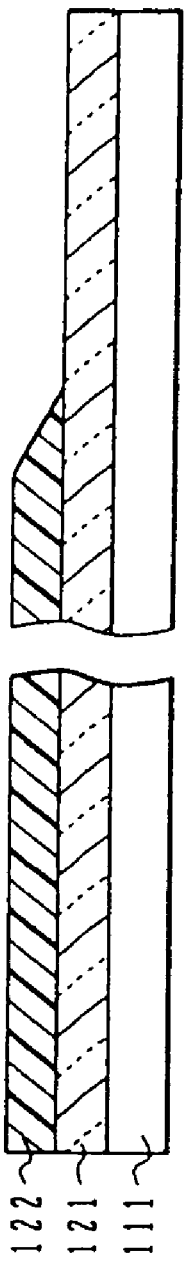
FIGS. 8A to 8C are cross sectional views showing a modification of the embodiment shown in FIGS. 6A to 6D.
Figure 8B:
Figure 8C:
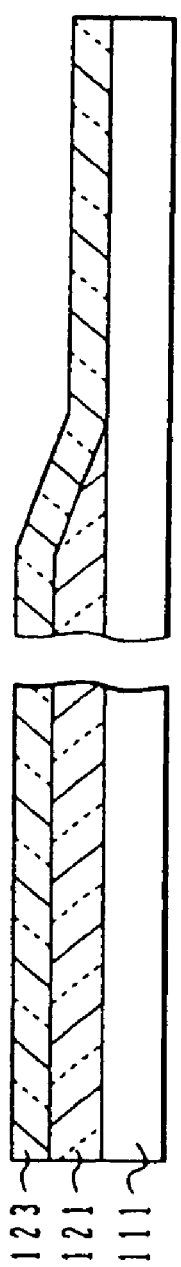

Silicon oxide doped with fluoride, silicon oxycarbide or the like may be used which can realize an insulating film having a dielectric constant lower than silicon oxide. These inorganic or organic silicon oxide films can be formed by CVD or the like. FIGS. 8A to 8C illustrate a modification in which an inorganic insulating film having a low dielectric constant is formed by CVD.

As shown in FIG. 8A, on an underlying structure 111, a silicon oxide film 121 doped with fluorine and having a thickness of, for example, 250 nm, is formed by CVD. On the surface of the fluorine-doped silicon oxide film 121, a photoresist layer 122 is formed and the portion thereof in the wafer edge area is removed by peripheral exposure. For example, the peripheral exposure is about 5±0.0.5 mm from the wafer edge.

As shown in FIG. 8B, by using the photoresist layer 122 as an etching mask, the underlying fluorine-doped silicon oxide layer 121 is removed by HF-containing etchant. Thereafter, the photoresist layer 122 is removed.

Instead of using the photoresist layer, the fluorine-doped silicon oxide layer 121 in the wafer edge area may be removed, for example, by dispensing etchant from a nozzle.

As shown in FIG. 8C, an insulating layer 123 such as a silicon oxide layer is formed on the underlying structure 111, covering the fluorine-doped silicon oxide layer 121 with its edge portion being removed.

Thereafter, a photoresist pattern is formed on the insulating layer 123 and then the process similar to that shown in FIG. 6A is performed.

The fluorine-doped silicon oxide layer may be formed on a coating type organic or inorganic insulating film. The fluorine-doped silicon oxide layer has a relatively low dielectric constant so that it has high moisture absorption. In order to avoid this, a fluorine-doped silicon oxide layer having a small fluorine dose or a fluorine-doped silicon oxide film in which nitrogen or the like is introduced may be used. Before the silicon nitride layer is formed, a degassing process and the like may be performed to remove impurities attached to the surface of the insulating film. For example, heat treatment is performed for about 30 minutes at 200° C.

Even if the outermost side wall of an organic insulating layer is exposed before the wiring layer is formed, a film peel-off and the like can be prevented if the wiring layer is not completely removed by CMP and the organic insulating layer is covered with the wiring layer.

FIGS. 9A to 9D illustrate some of manufacture processes for a semiconductor wafer device according to another embodiment of the invention. FIGS. 10A to 10D are plan views showing the distribution areas of a plurality of films formed by the manufacture processes shown in FIGS. 9A to 9D.

Figure 9A:
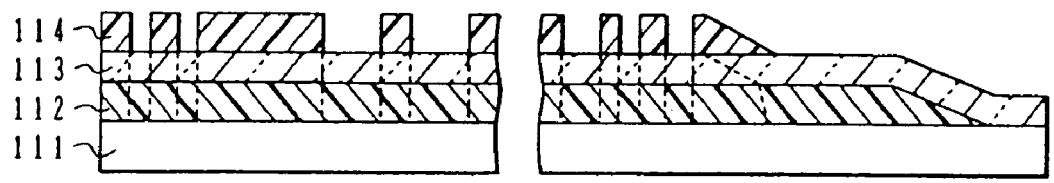
FIGS. 9A to 9L are schematic cross sectional views illustrating the manufacture processes for a semiconductor wafer device according to still another embodiment of the invention.

As shown in FIG. 9A, on the surface of an underlying structure 111, an organic insulating layer 112 is formed which is made of SiLK or the like and has a thickness of 250 nm. The edge portion of the organic insulating layer 112 is removed, for example, by 3±0.0.5 mm from the wafer edge by rinsing with etchant.

Figure 10A:
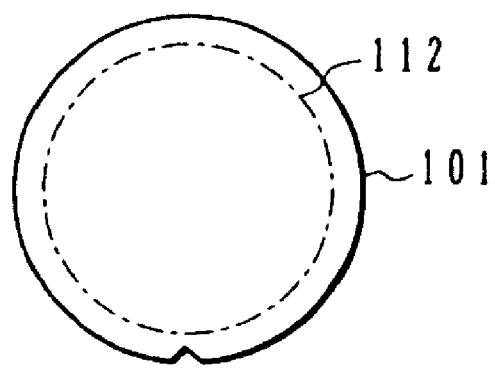
FIGS. 10A to 10D are plan views showing the layouts of a semiconductor wafer corresponding to the processes shown in FIGS. 9A to 9D.

FIG. 10A shows the state that the organic insulating layer 112 is formed on the semiconductor wafer 101. The organic insulating layer 112 has a shape retracted by a predetermined distance from the wafer edge.

Next, an insulating layer 113 is formed on the underlying structure 111, covering the. organic insulating layer 112, the insulating layer being made of a silicon oxide layer or the like having a thickness of about 250 nm. On the surface of the insulating layer 113, a photoresist layer 114 having openings for wiring patterns is formed. The photoresist layer 114 has openings for wiring patterns in the effective wafer area and openings for conductor patterns not used as wiring in the wafer edge area.

For example, the photoresist layer 114 is removed by 5±0.0.5 mm from the wafer edge by peripheral exposure. Thereafter, by using the photoresist layer 114 as an etching mask, the insulating layer 113 is etched by RIE using CF-containing etchant gas or the like.

Figure 10B:
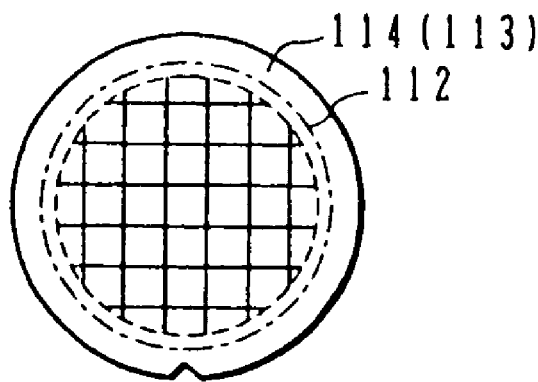

FIG. 10B shows the state that the insulating layer 113 is formed on the organic insulating layer 112 and the photoresist layer 114 is formed on the insulating layer 113. Because the insulating layer 113 is etched by using the photoresist layer 114 as the etching mask, the insulating layer 112 has the same plan shape as the photoresist layer 114.

In succession, by using the patterned insulating layer 113 as an etching mask, the organic insulating layer 112 is etched by RIE using $H_2$-containing etchant gas, $N_2$-containing etchant gas or the like. With this etching, the photoresist layer 114 is also removed at the same time. In the wafer edge area, the exposed outermost side wall of the organic insulating layer 112 is positioned in the peripheral exposure area.

Similar to the description for FIG. 6A, if the underlying structure 111 is silicon oxide, an etching step may be formed in the wafer edge area where the outermost side wall of the organic insulating layer 112 does not exist. However, this area is not formed with circuits so that there is no practical problem.

The semiconductor wafer is subjected to atmospheric pressure annealing, for example, at 400° C. in an atmosphere of $H_2/N_2$ to remove adsorbents on the exposed surface of the organic insulating layer 112.

Figure 9B:
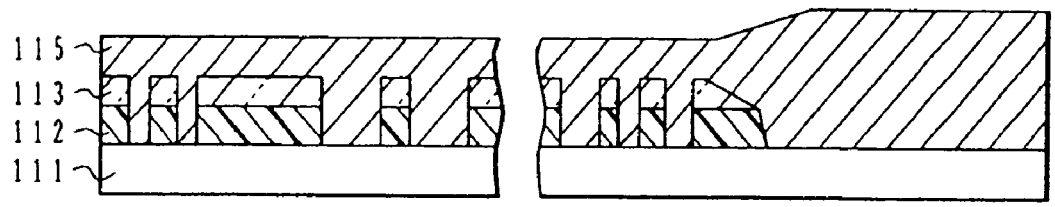

As shown in FIG. 9B, a wiring material layer 115 is formed being filled in the grooves in the patterned insulating layer 113 and organic insulating layer 112. For example, a Cu layer of about 1500 nm thick is used as the main wiring layer. In this case, the wiring layer is formed thicker in the wafer edge area, for example, to a thickness of 2000 nm to 2500 nm.

Similar to the above-described embodiment, the wiring layer 115 may be removed by about 1±0.0.5 mm from the wafer edge in order to prevent peel-off of the wiring layer in the wafer edge area.

Figure 10C:
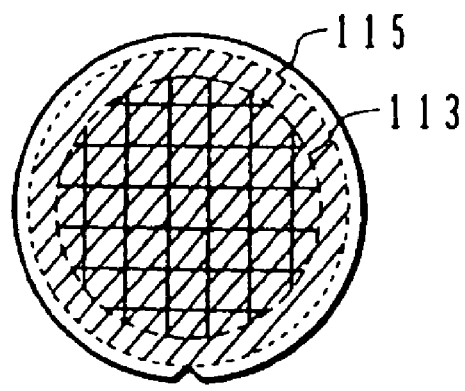

FIG. 10C shows the state that the wiring material layer 115 is formed covering the insulating layer 113. The wiring material layer 115 has a shape covering the insulating layer 113.

Figure 9C:
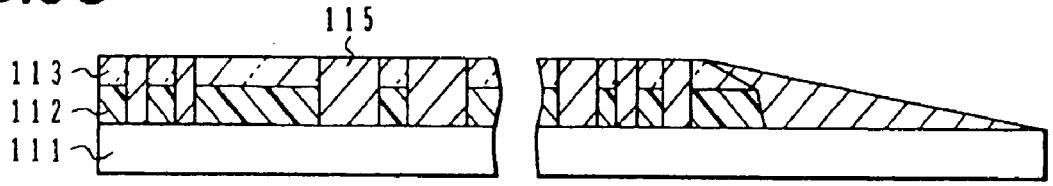

As shown in FIG. 9C, an unnecessary wiring layer deposited on the insulating layer 113 is removed by CMP. The wiring layer 115 is left only in the grooves formed in the insulating layer 113 and organic insulating layer 112.

Because the wiring layer 115 is formed thick in the wafer edge area, the wiring layer 115 is left on the outermost side walls of the insulating layer 113 and organic insulating layer 112 even after CMP. Therefore, the organic insulating layer 112 has no exposed surface.

If the wiring layer 115 is formed thick in an area inside the peripheral exposure area, the wiring layer 115 is left in the insulating layer 113 in some cases. However, there arises no practical problem.

Figure 10D:
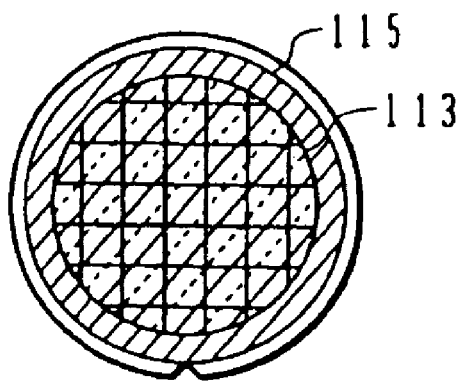

FIG. 10D shows the case after CMP. In the central wafer area, the organic insulating layer 112 and insulating layer 113 are formed, and in the area outside the central wafer area, only the wiring material layer 115 is left. The side wall of the organic insulating layer 112 under the insulating layer 113 is completely covered with the wiring material layer 115.

Figure 9D:
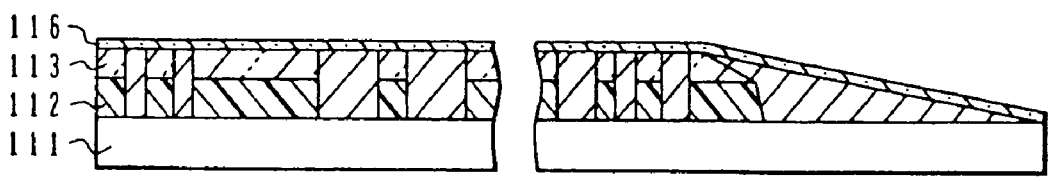

As shown in FIG. 9D, an etching stopper layer 116 is formed by CVD, covering the surface of the wiring layer after CMP. For example, the etching stopper layer 116 is made of a silicon nitride layer having a thickness of 50 nm. Even if $NH_3$ gas or the like is used for forming the silicon nitride layer, the organic insulating layer 112 is not decomposed or etched because it is not exposed.

Instead of SiLK, porous SiLK and other organic insulating layers may be used. Instead of the organic insulating layer, a coating type inorganic insulating layer such as HSQ or other inorganic insulating layers having a lower dielectric constant than silicon oxide may also be used.

In the above description, the insulating layer and organic insulating layer in the wafer edge area are removed to once expose the outermost side wall of the organic insulating layer and then cover the side wall with the wiring layer. After the structure that the organic insulating layer is covered with the insulating layer is formed as shown in FIGS. 6A and 8C, the wiring layer may be left on the outermost side wall of the organic insulating layer.

If a fluorine-doped silicon oxide layer, a silicon oxycarbide layer or the like is used, it is preferable to perform a process of removing surface adsorbents after anisotropic etching.

Figure 11A:
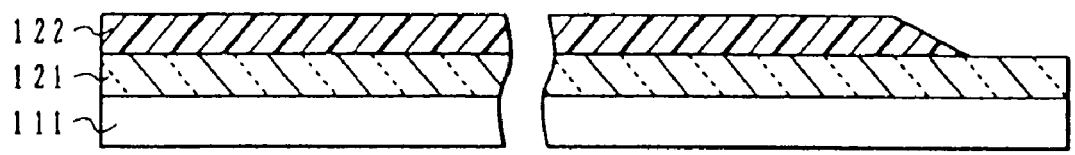
FIGS. 11A to 11C are cross sectional views showing a modification of the embodiment shown in FIGS. 9A to 9L.
Figure 11B:
Figure 11C:
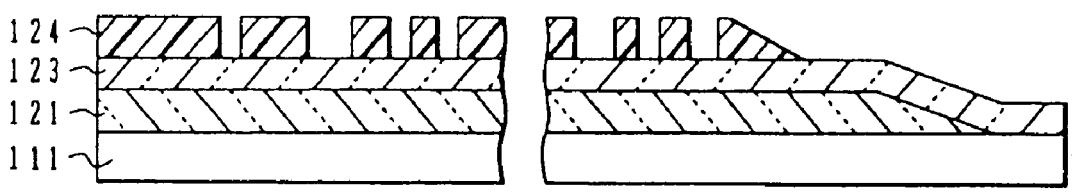

FIGS. 11A to 11C illustrate processes to be executed when a fluorine-doped silicon oxide layer is used in place of the coating type insulating layer.

As shown in FIG. 11A, on an underlying structure 111, a fluorine-doped silicon oxide layer 121 is formed by CVD.

A photoresist layer 122 is formed on the surface of the fluorine-containing silicon oxide layer 121 and the portion of the photoresist layer 122 is removed by about 3±0.0.5 mm from the wafer edge by peripheral exposure.

By using the photoresist layer 122 as an etching mask, the fluorine-doped silicon oxide layer 121 is etched by HF or the like. Thereafter, the photoresist layer 122 is removed.

FIG. 11B shows the shape of the fluorine-doped silicon oxide layer 121 formed by the above processes. Instead of using a photoresist mask, the fluorine-doped silicon oxide layer in the peripheral wafer area may be removed by etching using HF or the like.

As shown in FIG. 11C, an insulating layer 123 such as a silicon oxide layer is formed on the underlying structure 111, covering the fluorine-doped silicon oxide layer 121. A photoresist layer 124 having openings for wiring patterns is formed on the insulating layer 123. Thereafter, the process similar to that shown in FIG. 9A is performed.

FIGS. 9E to 9L are cross sectional views illustrating the processes of forming a dual damascene wiring structure such as shown in FIGS. 3A to 3I, following the process shown in FIG. 9D.

Figure 9E:
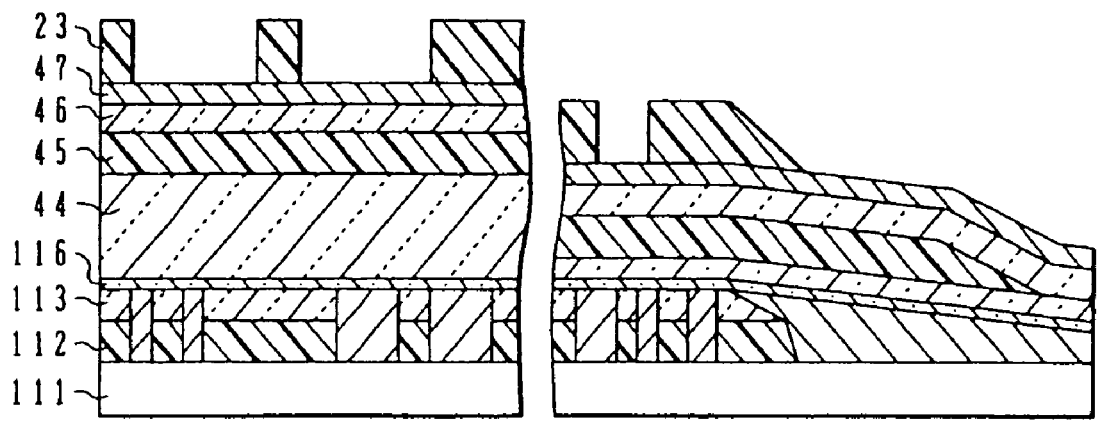

As shown in FIG. 9E, on the etching stopper layer 116, an insulating layer 44 made of an $SiO_2$ layer of about 1200 nm thick is formed by CVD. After the insulating layer 44 is deposited, the surface thereof is planarized by CMP. With this CMP, the remaining film thickness in the effective wafer area is, for example, about 700 nm and that in the wafer edge area is, for example, about 300 nm.

After CMP, an organic insulating film 45 made of SiLK or the like is coated on the insulating layer 44 to a thickness of, for example, 250 nm. After coating, the organic insulating film 45 is removed by a constant width from the wafer edge. The organic insulating film 45 is then cured by heat treatment. On this organic insulating film 45, an insulating layer 46 made of an $SiO_2$ layer or the like having a thickness of about 250 nm is formed by CVD. On the insulating layer 46, a metal layer 47 is formed which is made of, for example, a TiN layer of 100 nm thick.

On this metal layer 47, a resist pattern 23 is formed. The resist pattern is removed by a constant distance from a wafer edge, for example, by 5±0.0.5 mm by peripheral exposure. The resist pattern 23 has openings for wiring grooves. By using the resist pattern 23 as an etching mask, the metal layer 47 is etched. Thereafter, the resist pattern 23 is removed.

Figure 9F:
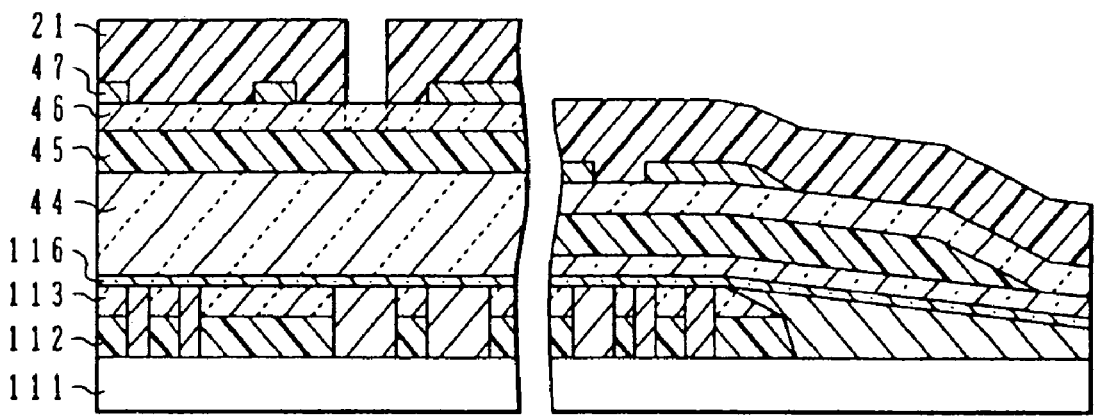

As shown in FIG. 9F, a new resist pattern 21 is formed on the insulating layer 46, covering the patterned metal layer 47. The resist pattern 21 has openings for via holes in the effective wafer area. By using the resist pattern 21 as an etching mask, the insulating layer 46 is etched by using CF-containing gas or the like.

Figure 9G:
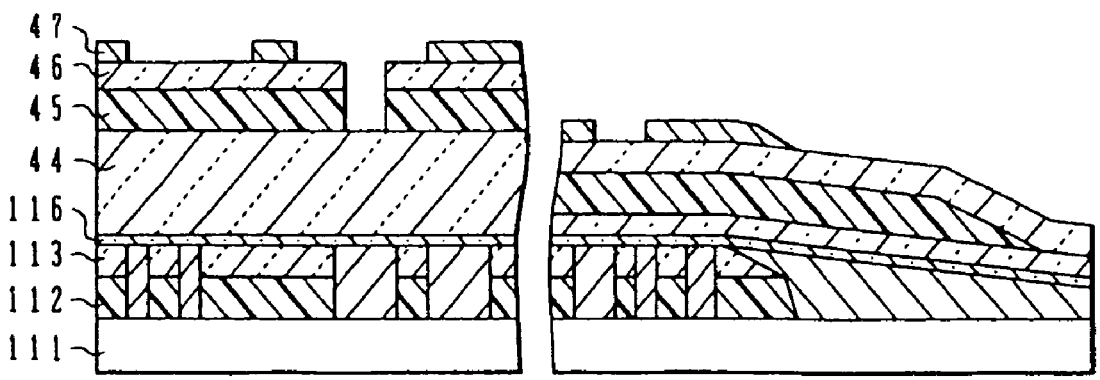

As shown in FIG. 9G, by using the insulating layer 46 as an etching mask, the organic insulating layer 45 is etched by using $H_2$-containing gas, $N_2$-containing gas or the like. With this etching, the resist pattern 21 is also etched. In the effective wafer area, the insulating layer 44 is exposed on the bottom of each via hole.

Figure 9H:
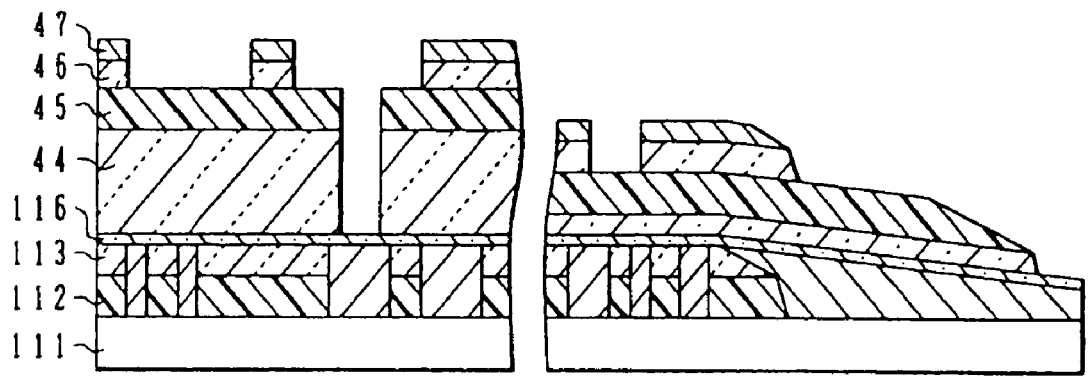
Figure 9I:
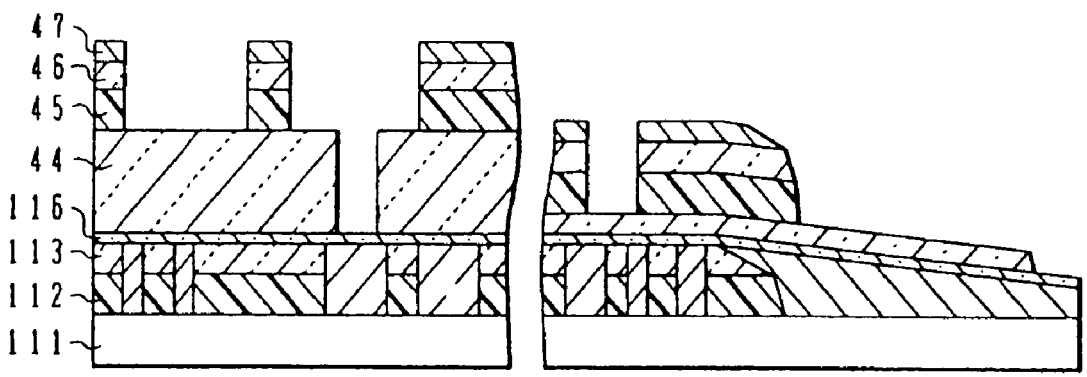

As shown in FIG. 9H, by using the metal layer 47 and organic insulating layer 45 as an etching mask, the insulating layers 46 and 44 are etched. In the effective wafer area, the etching stopper 116 is exposed and the etching stops in the state that the organic insulating layer 45 is exposed. In the wafer edge area where the organic insulating layer 45 was removed, the insulating layers 46 and 44 are etched. There is no problem of over-etching in this area.

As shown in FIG. 9, by using the metal layer 47 and insulating layer 46 as an etching mask and changing the etching gas to $H_2$-containing or $N_2$-containing etching gas, the organic insulating layer 45 is etched. With the above processes, wiring grooves area formed.

Figure 9J:
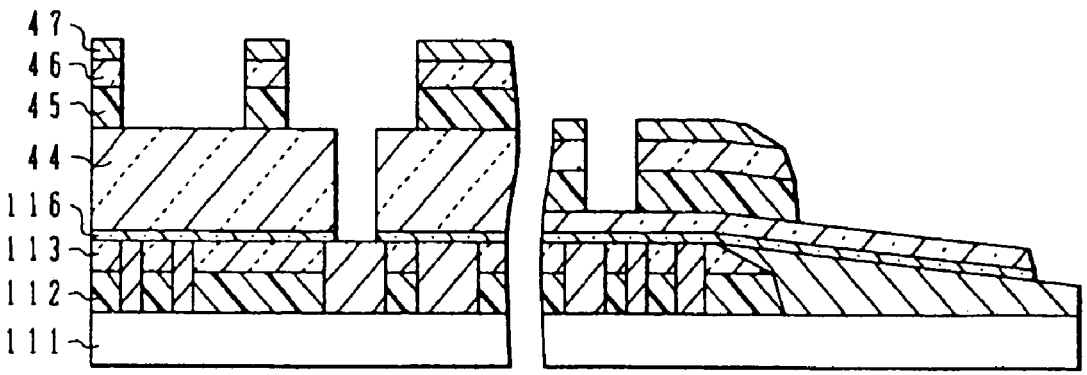

As shown in FIG. 9J, the etching stopper layer 116 exposed on the bottom of each via hole is etched by using CHF-containing etching gas or the like to expose the surface of the underlying wiring layer.

Figure 9K:
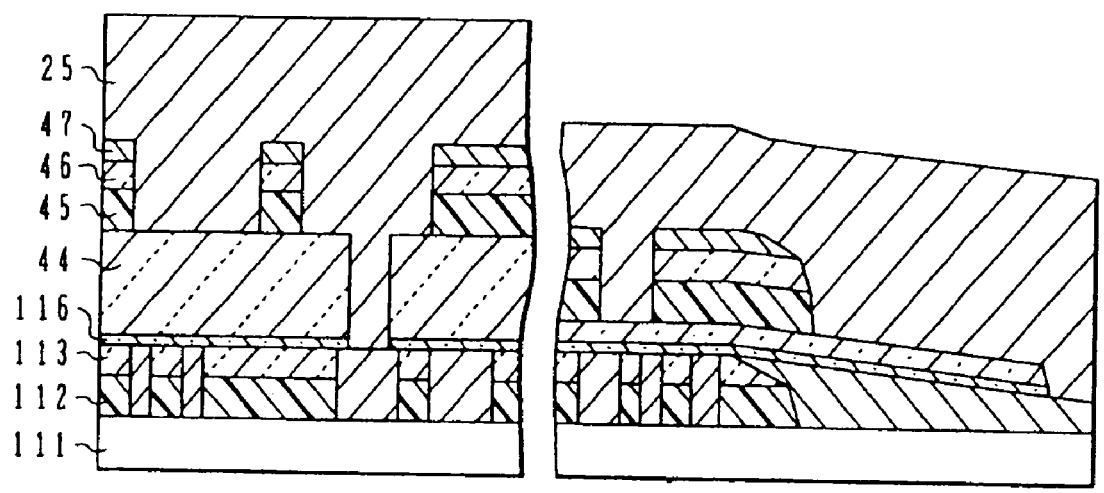

As shown in FIG. 9K, on the interlevel insulating film structure formed with wiring grooves and via holes, a wiring layer 25 of a barrier layer and a main wiring layer is deposited.

Figure 9L:
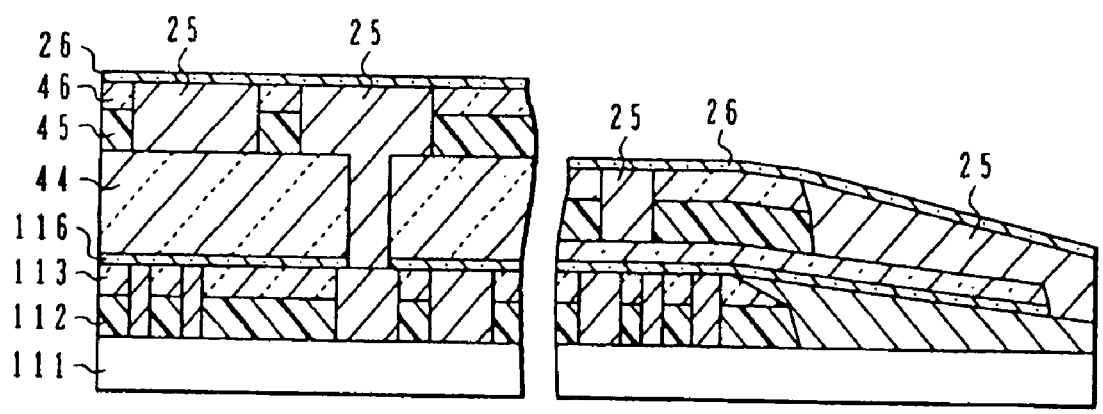

As shown in FIG. 9L, the wiring layer 25 is polished by CMP from its surface to remove unnecessary regions of the wiring layer 25 and metal layer 47. In this case, in the wafer edge area, polishing is stopped in the state that the wiring layer 25 covers the side wall of the organic insulating layer 45. An etching stopper layer made of, for example, an SiN layer of 50 nm thick or a surface protective layer is formed covering the surface of the wiring layer 25.

In the above description, a dual damascene wiring structure covering the outermost side wall of the organic insulating layer with the wiring layer is formed. Instead, as shown in FIG. 6A and FIG. 8C, it is obvious to those skilled in the art that a dual damascene wiring structure covering the outermost side wall of the organic insulating layer with the insulating layer may be formed.

The present invention has been described in connection with the preferred embodiments. The invention is not limited only to the above to follow, a single damascene structure having only conductor patterns is formed in the wafer edge area. Even if this structure is omitted, the outermost side wall of a low dielectric constant insulating layer can be protected from a CMP environment. It is apparent that various modifications, improvements, combinations, and the like can be made by those skilled in the art.

I claim:

1. A method of manufacturing a semiconductor wafer device, comprising the steps of:

(a) forming first lower wiring patterns over a semiconductor wafer having semiconductor elements formed in a circuit area and forming second lower wiring patterns in a wafer peripheral area, the first lower wiring patterns being connected to the semiconductor elements;

(b) forming an interlevel insulating film over the semiconductor wafer, the interlevel insulating film covering the first lower wiring patterns and the second lower wiring patterns and having a planarized surface; and (c) forming via conductors connected to the first lower wiring patterns, wiring patterns disposed on the via conductors in the circuit area and conductor patterns made of a same material as the wiring patterns in the wafer peripheral area other than the circuit area, by embedding the via conductors, wiring patterns and conductor patterns in the intertevel insulating film, the conductive patterns being electrically isolated from the second wiring patterns.

2. The method of manufacturing a semiconductor wafer device according to claim 1, wherein:
said step (b) includes a step of sequentially laminating a first etching stopper layer, a first insulating layer having a planarized surface, a second insulating layer and a third insulating layer; and
said step (c) includes a step (c-1) of selectively removing the third and second insulating layers to form wiring pattern grooves in the circuit area and conductor pattern grooves in a peripheral area other than the circuit area, a step (c-2) of forming holes through the first insulating layer and the first etching stopper layer in the circuit area, each hole extending from a bottom of the wiring pattern groove to the lower wiring pattern, and a step (c-3) of filling conductors in the wiring pattern grooves, holes and conductor pattern grooves.

3. The method of manufacturing a semiconductor wafer device according to claim 1, wherein:
said step (b) includes a step (b-1) of laminating a first etching stopper layer and a first insulating layer, a step (b-2) of polishing the first insulating layer to planarize an upper surface of the first insulating layer, and a step (b-3) of laminating a second insulating layer and a third insulting layer on the planarized surface; and
said step (c) includes a step (c-1) of forming holes through the first insulating layer and first etching stopper layer in the circuit area to expose surfaces of the lower wiring patterns, after said step (b-2), a step (c-2) of filling via conductors in the holes, a step (c-3) of selectively removing the third and second insulating layers to form wiring pattern grooves exposing surfaces of the via conductors in the circuit area and conductor pattern grooves in a peripheral area other than the circuit area, after said step (b-3), and a step (c4) of filling conductors in the wiring pattern grooves and conductor pattern grooves.

4. The method of manufacturing a semiconductor wafer device according to claim 2, wherein:
said step (b) includes a step (b-1) of laminating an etching stopper layer and a first insulating layer, a step (b-2) of planarizing an upper surface of the first insulating layer, and a step (b-3) of laminating a second insulating layer having a lower dielectric constant than silicon oxide on the planarized first insulating layer and a third insulating layer having a dielectric constant higher than the lower dielectric constant; and
said step (c) includes a step of covering an outermost side wall of the second insulating layer with the third insulating layer or the conductor.

5. The method of manufacturing a semiconductor wafer device according to claim 2, wherein:
said step (b) includes a step (b-1) of forming a first insulating layer having a lower dielectric constant lower than silicon oxide, a step (b-2) of removing the first insulating layer in the peripheral area, and a step (b-3) of forming a second insulating layer having a dielectric constant higher than the lower dielectric constant on the semiconductor wafer; and
said step (c) includes a step of covering an outermost side wall of the first insulating layer with the second insulating layer or the conductor.

6. A method of manufacturing a semiconductor wafer device, comprising the steps of:
(a) forming a first insulating layer having a lower dielectric constant than silicon oxide over an underlying structure including a semiconductor wafer;
(b) removing the first insulating layer in a peripheral area of the semiconductor wafer;
(c) forming a second insulating layer having a higher dielectric constant than the first insulating layer, the second insulating layer covering an outermost side wall of the first insulating layer;
(d) forming wiring grooves at least through the second insulating layer;
(e) forming a conductive layer an the second insulating layer; and
(f) polishing the conductive layer to leave wiring patterns in the wiring grooves and to form a configuration wherein an outermost side wall of the first insulating layer is covered with the second insulating layer or the conductive layer.

7. The method of manufacturing a semiconductor wafer device according to claim 6, wherein said step (d) leaves the second insulating layer covering the outermost side wall of the first insulating layer, and said step (f) covers the outermost side wall of the first insulating layer with the second insulating layer.

8. The method of manufacturing a semiconductor wafer device according to claim 6, wherein said step (d) exposes the outermost side wall of the first insulating layer outside the wiring grooves, said step (e) forms the conductive layer which is thicker in a peripheral area than in a central area of the semiconductor wafer, and said step (f) leaves the conductive layer covering the outermost side wall of the first insulating layer.

9. The method of manufacturing a semiconductor wafer device according to claim 6, further comprising the steps of:
(g) forming an etching stopper layer and a lower insulating layer before said step (a); and
(h) forming via holes continuous with the wiring grooves through the lower insulating layer and the etching stopper layer.

10. The method of manufacturing a semiconductor wafer device according to claim 9, further comprising a step of:
(h) planarizing the lower insulating layer after said step (g), wherein said steps (e) and (f) form damascene wirings.

11. The method of manufacturing a semiconductor wafer device according to claim 6, wherein the first insulating layer having the lower dielectric constant is one of a coating type insulating layer, a silicon oxide film containing fluorine or carbon, and a porous insulating layer.

* * * * *